(12) United States Patent
Otsubo et al.

(10) Patent No.: US 12,279,374 B2
(45) Date of Patent: Apr. 15, 2025

(54) CIRCUIT MODULE AND METHOD FOR MANUFACTURING SUBMODULE

(71) Applicant: Murata Manufacturing Co., Ltd., Kyoto (JP)

(72) Inventors: Yoshihito Otsubo, Nagaokakyo (JP); Minoru Hatase, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 166 days.

(21) Appl. No.: 18/169,333

(22) Filed: Feb. 15, 2023

(65) Prior Publication Data

US 2023/0199965 A1    Jun. 22, 2023

Related U.S. Application Data

(63) Continuation of application No. PCT/JP2021/023191, filed on Jun. 18, 2021.

(30) Foreign Application Priority Data

Aug. 31, 2020  (JP) ................................ 2020-146162

(51) Int. Cl.
*H05K 1/02* (2006.01)
*H01L 23/538* (2006.01)
(Continued)

(52) U.S. Cl.
CPC ............. *H05K 1/181* (2013.01); *H05K 1/023* (2013.01); *H05K 3/284* (2013.01)

(58) Field of Classification Search
CPC ...... H05K 1/02; H05K 1/0216; H05K 1/0218; H05K 1/023; H05K 1/141; H05K 1/147;
(Continued)

(56) References Cited

U.S. PATENT DOCUMENTS

2010/0027225 A1*  2/2010  Yuda ................... H05K 3/4697
                                                            156/247
2013/0271928 A1   10/2013  Shimamura et al.
(Continued)

FOREIGN PATENT DOCUMENTS

JP          2004-172176 A       6/2004
JP            4424449 B2        3/2010
(Continued)

OTHER PUBLICATIONS

International Search Report for PCT/JP2021/023191 dated Aug. 24, 2021.

*Primary Examiner* — Xiaoliang Chen
(74) *Attorney, Agent, or Firm* — McDonald Hopkins LLC

(57) ABSTRACT

A circuit module includes: a main substrate; a submodule that is mounted on a top surface of the main substrate; a main sealing resin that is provided on the top surface of the main substrate, and covers at least part of the submodule; and a conductive shield film that covers at least part of the main sealing resin. The submodule includes a sub-substrate, an electronic part that is mounted on a top surface of the
(Continued)

sub-substrate, a plurality of conductive members that have linear shapes, and are connected to the top surface of the sub-substrate and the shield film, and a subsealing resin that is provided on the top surface of the sub-substrate, and covers the electronic part and part of each of the plurality of conductive members.

15 Claims, 27 Drawing Sheets

(51) Int. Cl.
    *H01L 23/552*     (2006.01)
    *H01L 25/18*     (2023.01)
    *H05K 1/18*     (2006.01)
    *H05K 3/28*     (2006.01)

(58) Field of Classification Search
    CPC ........ H05K 1/181; H05K 1/183; H05K 1/185; H05K 3/284; H05K 3/4697; H05K 9/0084; H01L 23/538; H01L 23/552; H01L 23/3121; H01L 23/3135; H01L 23/5286; H01L 23/5386; H01L 25/0652; H01L 25/0655; H01L 25/18; H01L 25/105
    USPC ............ 361/760, 728, 736; 156/247; 29/832
    See application file for complete search history.

(56) References Cited

U.S. PATENT DOCUMENTS

| | | | |
|---|---|---|---|
| 2015/0070851 | A1 | 3/2015 | Kitazaki et al. |
| 2020/0365476 | A1 | 11/2020 | Otsubo et al. |
| 2021/0043585 | A1 | 2/2021 | Nomura et al. |
| 2021/0074641 | A1* | 3/2021 | Sung ..................... H01L 25/105 |
| 2023/0319977 | A1* | 10/2023 | Sato ........................ H01L 25/18 |
| | | | 361/728 |

FOREIGN PATENT DOCUMENTS

| | | |
|---|---|---|
| JP | 2012-160576 A | 8/2012 |
| JP | 5276169 B2 | 8/2013 |
| JP | 2013-222829 A | 10/2013 |
| JP | 5550159 B1 | 7/2014 |
| WO | 2010/014103 A1 | 2/2010 |
| WO | 2010/041356 A1 | 4/2010 |
| WO | 2019/156051 A1 | 8/2019 |
| WO | 2019/216300 A1 | 11/2019 |

* cited by examiner

CIRCUIT MODULE AND METHOD FOR MANUFACTURING SUBMODULE

CROSS REFERENCE TO RELATED APPLICATION

This is a continuation of International Application No. PCT/JP2021/023191 filed on Jun. 18, 2021 which claims priority from Japanese Patent Application No. 2020-146162 filed on Aug. 31, 2020. The contents of these applications are incorporated herein by reference in their entireties.

BACKGROUND OF THE DISCLOSURE

Field of the Disclosure

The present disclosure relates to a circuit module that includes a submodule, and a submodule manufacturing method.

Description of the Related Art

A circuit module including a submodule is known. The circuit module includes various electronic parts mounted on a substrate. The submodule includes a substrate different from the substrate of the circuit module, and various electronic parts mounted on this substrate, and are formed by packaging these substrate and various electronic parts. The submodule is mounted on the substrate of the circuit module similarly to other electronic parts.

It is known to provide shields that block an electromagnetic wave around a circuit module and electronic parts. The shield reduces entry of an electromagnetic wave into the electronic parts from an outside of the circuit module. Furthermore, the shields reduce leakage of the electromagnetic waves generated in the electronic parts to the outside. The shields include a shield that covers the entire circuit module, and shields that individually cover the electronic parts. Patent Document 1 discloses, for example, a circuit module in which respective electronic parts are individually covered with shields.

According to the circuit module disclosed in Patent Document 1, the entire circuit module is covered with a first shield part, and each electronic part mounted on a substrate of the circuit module is partitioned from each other by a second shield part extending downward from the first shield part.

Patent Document 1: JP 5550159 B2

BRIEF SUMMARY OF THE DISCLOSURE

In order to effectively block an electromagnetic wave in a submodule, electronic parts mounted on a substrate of the submodule are desirably shielded separately from electronic parts mounted on a substrate of a circuit module. For example, a shield such as the second shield part of the circuit module disclosed in Patent Document 1 desirably partitions the submodule mounted on the substrate of the circuit module from other electronic parts mounted on the substrate of the circuit module.

However, in a case where the shield such as the second shield part of the circuit module disclosed in Patent Document 1 partitions the submodule from other electronic parts, the second shield part that is a wall having a thickness is disposed between the submodule and the other electronic parts. Therefore, an area of the substrate of the circuit module on which the submodule and the electronic parts are mounted increases.

Therefore, a possible benefit of the present disclosure is to solve the above problem, and provide a circuit module that can enhance shielding performance for a submodule while suppressing an increase in size of the circuit module.

In order to achieve the above possible benefit, the present disclosure is configured as follows.

A circuit module according to one aspect of the present disclosure includes: a main substrate; a submodule that is mounted on a top surface of the main substrate; a main sealing resin that is provided on the top surface of the main substrate, and covers at least part of the submodule; and a conductive shield film that covers at least part of the main sealing resin, and the submodule includes a sub-substrate, an electronic part that is mounted on a top surface of the sub-substrate, a plurality of conductive members that have linear shapes or bar shapes, and are connected to the top surface of the sub-substrate and the shield film, and a subsealing resin that is provided on the top surface of the sub-substrate, and covers at least part of the electronic part and part of each of the plurality of conductive members.

According to the present disclosure, it is possible to enhance shielding performance for a submodule while suppressing an increase in size of the circuit module.

DETAILED DESCRIPTION OF THE DISCLOSURE

Figure 1:
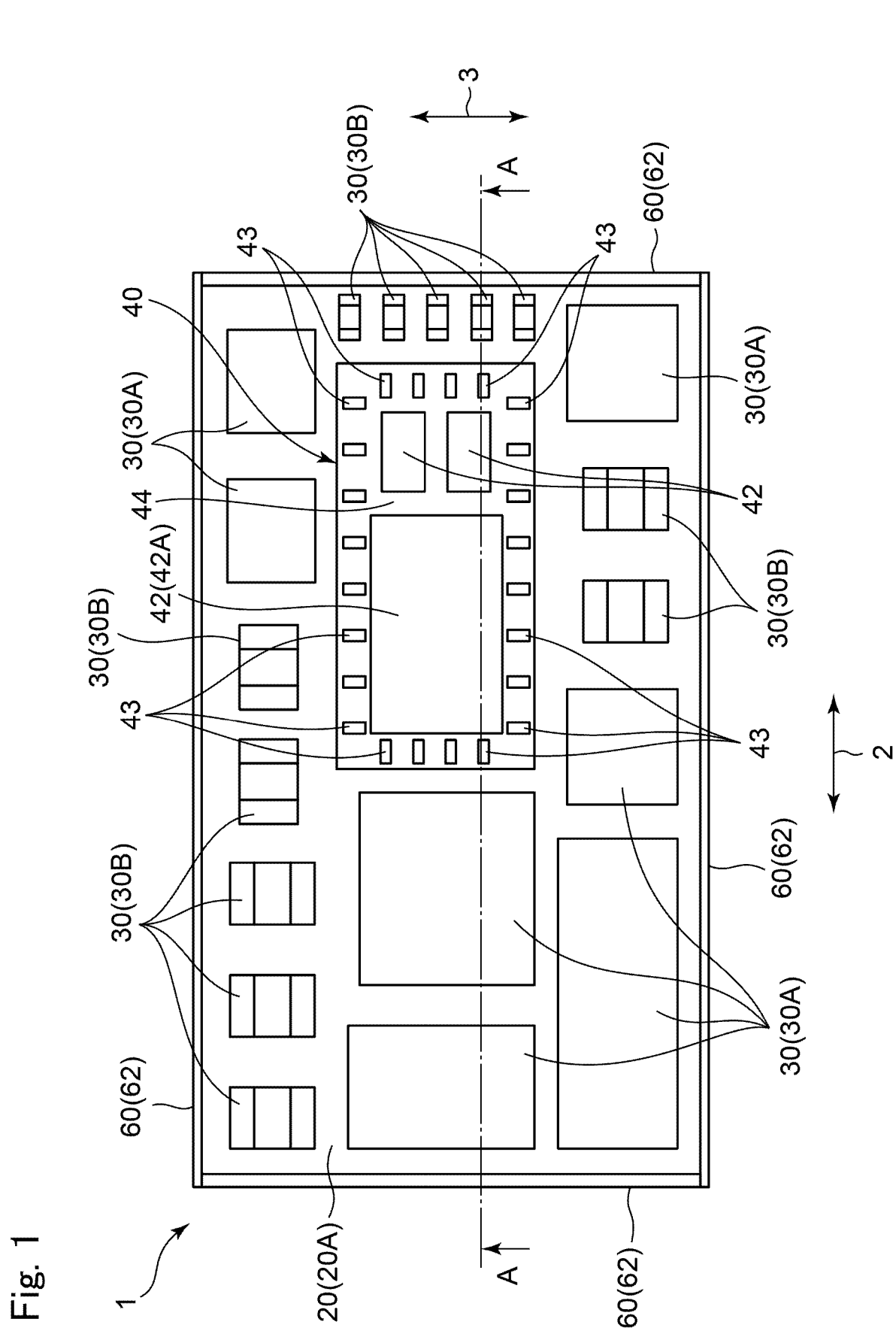
FIG. 1 is a plan view of a circuit module according to a first embodiment of the present disclosure.

A circuit module according to one aspect of the present disclosure includes: a main substrate; a submodule that is mounted on a top surface of the main substrate; a main sealing resin that is provided on the top surface of the main substrate, and covers at least part of the submodule; and a conductive shield film that covers at least part of the main sealing resin, and the submodule includes a sub-substrate, an electronic part that is mounted on a top surface of the sub-substrate, a plurality of conductive members that have linear shapes or bar shapes, and are connected to the top surface of the sub-substrate and the shield film, and a subsealing resin that is provided on the top surface of the sub-substrate, and covers at least part of the electronic part and part of each of the plurality of conductive members.

According to this configuration, it is possible to cover the submodule with the conductive members and the shield film. That is, it is possible to cause part of the shield film that function as shields of the entire circuit module to function as shields of the submodule. The conductive members and the shield film can individually cover the submodule, so that it is possible to enhance shielding performance for the submodule.

Furthermore, according to this configuration, the conductive members have the linear shapes or the bar shapes, so that it is possible to suppress an increase in the area of the sub-substrate of the submodule compared to the configuration where the conductive members have wall shapes. Consequently, it is possible to suppress an increase in size of the circuit module.

The shield film includes an upper film that covers an upper side of the main sealing resin, and the plurality of conductive members are connected with the upper film. According to this configuration, it is possible to shield upper sides of the electronic parts of the submodule with the upper film, and shield lateral sides of the electronic parts of the submodule with the conductive members.

The electronic part is surrounded by the plurality of conductive members in plan view. According to this configuration, the electronic parts of the submodule are surrounded by the plurality of conductive members, so that it is possible to enhance the shielding performance for the lateral sides of the electronic parts of the submodule.

The shield film includes a side film that covers a lateral side of the main sealing resin, and the electronic part is surrounded by the plurality of conductive members and the side film in plan view. According to this configuration, it is possible to cause part of the side film to function as shields that cover the lateral sides of the electronic parts of the submodule. Consequently, it is possible to enhance the shielding performance for the submodule while reducing the number of conductive members mounted on the sub-substrate. Furthermore, the number of conductive members mounted on the sub-substrate is reduced, so that it is possible to miniaturize the sub-substrate.

The shield film includes a side film that covers a lateral side of the main sealing resin, the sub-substrate includes a planar electrode that is conducted with the plurality of conductive members, and a side surface of the planar electrode is exposed from a lateral side of the sub-substrate, and connected with the side film.

The planar electrode is conducted with the plurality of conductive members. According to this configuration, the conductive members and, in addition, the planar electrodes conducted with the conductive members are connected with the shield film. The number of portions to be connected with the shield film is increased in this way, so that it is possible to increase reference potentials of grounds or the like in the shield film and the conductive members.

The electronic part is surrounded by the plurality of conductive members and the planar electrode in plan view. According to this configuration, it is possible to cause the planar electrodes to function as the shields of the lateral side of the electronic part of the submodule. Consequently, it is possible to enhance the shielding performance for the submodule while reducing the number of conductive members mounted on the sub-substrate. Furthermore, the number of conductive members mounted on the sub-substrate is reduced, so that it is possible to miniaturize the sub-substrate.

At least part of the planar electrode overlaps at least part of the electronic part in plan view. According to this configuration, it is possible to cause the planar electrodes to function as the shields for lower sides of the electronic parts of the submodule. Consequently, it is possible to enhance the shielding performance for the submodule.

The shield film includes a side film that covers a lateral side of the main sealing resin, and each of the plurality of conductive members includes an upward extending part that extends upward from a top surface of the sub-substrate, and a laterally extending part that extends laterally from a distal end part of the upward extending part, and a distal end part of the laterally extending part is connected with the side film. According to this configuration, it is possible to shield the lateral sides of the electronic parts of the submodule with the upward extending parts of the conductive members, and shield the upper sides of the electronic parts of the submodule with the laterally extending parts of the conductive members.

At least part of the laterally extending part overlaps at least part of the electronic part in plan view. When the upper end parts of the electronic parts of the submodule are at positions lower than upper end parts of other electronic parts mounted on a main substrate together with the submodule, an interval in a height direction between the shield film and the electronic parts of the submodule becomes longer. Consequently, the shielding performance for the submodule deteriorates. According to this configuration, it is possible to dispose the laterally extending parts of the conductive members near the upper end parts of the electronic parts of the submodule. Consequently, it is possible to effectively shield the upper sides of the electronic parts of the submodule with the laterally extending parts of the conductive members.

The submodule further includes a non-linear terminal that is disposed in a back surface of the sub-substrate, and is conducted with the plurality of conductive members, and the terminal is connected with the main substrate, and conducted with the shield film via the main substrate. For example, the terminal has a bar shape. The terminals disposed in the back surface of the sub-substrate of the submodule come into contact with a top surface of the main substrate, and thereby the submodule is mounted on the main substrate. In a case where the terminals disposed in the back surface of the sub-substrate have the linear shapes, the positions of the terminals may be displaced respect to the main substrate when the submodule is mounted on the main substrate. According to this configuration, the terminals disposed in the back surface of the sub-substrate have the non-linear shapes. Consequently, it is possible to reduce a probability that position displacement occurs as described above.

The plurality of conductive members have linear shapes. The distal end part of the conductive member is connected with the shield film. The shield film is a film, and therefore spreads planarly. Therefore, even when the positions of the conductive members are displaced, it is possible to connect the conductive members with the shield film. Therefore, even when the conductive members have the linear shapes that readily cause position displacement as in this configuration, no problem occurs. On the other hand, the conductive members have the linear shapes, so that it is possible to suppress an increase in size of the sub-substrate of the submodule.

A method for manufacturing a submodule mounted on a circuit module according to an aspect of the present disclosure, the method includes: a mounting step of mounting an electronic part on a top surface of a sub-substrate; a connecting step of connecting a plurality of conductive members having linear shapes or bar shapes to the top surface of the sub-substrate; and a covering step of covering at least part of the electronic part with a subsealing resin, and covering the plurality of conductive members with the subsealing resin at such postures at which at least a distal end part of each of the plurality of conductive members is exposed upward.

According to this method, the conductive members are covered with the subsealing resin in the covering step, so that it is possible to maintain the postures of the conductive members as postures at which the conductive members extend upward from base end parts connected to the top surface of the sub-substrate.

Furthermore, according to this method, the conductive members take the postures at which the distal end parts of the conductive members are exposed upward in the covering step, so that it is easy to connect the conductive members to the shield film when an upper side of the manufactured submodule is shielded by the shield film.

A method for manufacturing a submodule mounted on a circuit module according to an aspect of the present disclosure, the method includes: a mounting step of mounting an electronic part on a top surface of a sub-substrate; a connecting step of connecting two positions to the top surface of the sub-substrate such that a top part of each of the plurality of conductive members having linear shapes is located above the top surface of the sub-substrate, the two portions being located on both sides of the top part of each of the plurality of conductive members; a covering step of covering the electronic part and the plurality of conductive members with a subsealing resin; and a removing step of removing the top part of each of the plurality of conductive members by removing an upper part of the subsealing resin, and dividing each of the plurality of conductive members into two conductive members taking such postures that the two conductive members stand upward from the top surface of the sub-substrate and distal end parts are exposed upward.

According to this method, it is possible to easily connect the conductive members to the sub-substrate in the connecting step by known wire bonding.

Furthermore, according to this method, the removing step is executed, so that it is possible to create from the one conductive member the two conductive members that can shield lateral sides of the electronic parts of the submodule.

A method for manufacturing a submodule mounted on a circuit module according to an aspect of the present disclosure, the method includes: a mounting step of mounting an electronic part on a top surface of each of a plurality of sub-substrates on a coupling substrate formed by integrating the plurality of sub-substrates in a state where the top surfaces of the plurality of sub-substrates are disposed on a same plane; a connecting step of connecting a first part to a first sub-substrate, and connecting a second part to a second sub-substrate such that a top part of each of the plurality of conductive members having linear shapes is located above a top surface of the coupling substrate, the first part being located on one side of the top part of each of the plurality of conductive members, the first sub-substrate constituting the coupling substrate, the second part being located on the other side of the top part of each of the plurality of conductive members, and the second sub-substrate being adjacent to the first sub-substrate constituting the coupling substrate; a covering step of covering the electronic part and the plurality of conductive members with a subsealing resin; and a substrate dividing step of dividing the coupling substrate into the plurality of sub-substrates by cutting the coupling substrate and the subsealing resin.

According to this method, it is possible to easily connect the conductive members to the sub-substrate in the connecting step by known wire bonding.

Furthermore, according to this method, the substrate dividing step is executed, so that it is possible to manufacture, from the one coupling substrate including the one conductive member, the two or more sub-substrates on each of which the conductive members whose distal end parts are laterally exposed are mounted.

In the connecting step, each of the plurality of conductive members is connected to the first sub-substrate and the second sub-substrate such that the top part of each of the plurality of conductive members passes directly above both of the electronic part mounted on the first sub-substrate and the electronic part mounted on the second sub-substrate. According to this method, the substrate dividing step is executed, so that it is possible to manufacture, from one coupling substrate including one conductive member, two or more sub-substrates on each of which conductive members that can shield lateral sides and upper sides of the electronic parts of the submodule are mounted.

A method for manufacturing a submodule mounted on a circuit module according to an aspect of the present disclosure, the method further includes a removing step of removing the top part of each of a plurality of conductive members by removing an upper part of the subsealing resin, and dividing each of the plurality of conductive members into a first conductive member and a second conductive member, the first conductive member taking such a posture that the first conductive member stands upward from a top surface of the first sub-substrate, and a distal end part is exposed upward, and the second conductive member taking such a posture that the second conductive member stands upward from a top surface of the second sub-substrate, and a distal end part is exposed upward. According to this method, the removing step is executed, so that it is possible to create from the one conductive member the two conductive members that can shield lateral sides of the electronic parts of the submodule.

A method for manufacturing a submodule mounted on a circuit module according to an aspect of the present disclosure is a method for manufacturing a submodule mounted on a circuit module, and the method includes: a mounting step of mounting an electronic part on a top surface of each of a plurality of sub-substrates on a coupling substrate formed by integrating the plurality of sub-substrates in a state where the top surfaces of the plurality of sub-substrates are disposed on a same plane; a connecting step of connecting a first part to a first sub-substrate, and connecting a second part to a boundary part such that a top part of each of the plurality of conductive members having linear shapes is located above a top surface of the coupling substrate, the first part being located on one side of the top part of each of the plurality of conductive members, the first sub-substrate constituting the coupling substrate, the second part being located on the other side of the top part of each of the plurality of conductive members, and the boundary part being provided between the first sub-substrate constituting the coupling substrate, and a second sub-substrate adjacent to the first sub-substrate; a covering step of covering the electronic part and the plurality of conductive members with a subsealing resin; and a substrate dividing step of dividing the coupling substrate into the plurality of sub-substrates by removing the boundary part.

According to this method, it is possible to easily connect the conductive members to the sub-substrate in the connecting step by known wire bonding.

Furthermore, according to this method, the substrate dividing step is executed, so that it is possible to manufacture the sub-substrates on which the conductive members whose distal end parts are laterally exposed are mounted.

In the connecting step, each of the plurality of conductive members is connected to the first sub-substrate and the boundary part such that the top part of each of the plurality of conductive members passes directly above the electronic part mounted on the first sub-substrate. According to this method, the substrate dividing step is executed, so that it is possible to manufacture the sub-substrates on which the conductive members that can shield the lateral sides and the upper sides of the electronic parts of the submodules are mounted.

First Embodiment

Figure 2:
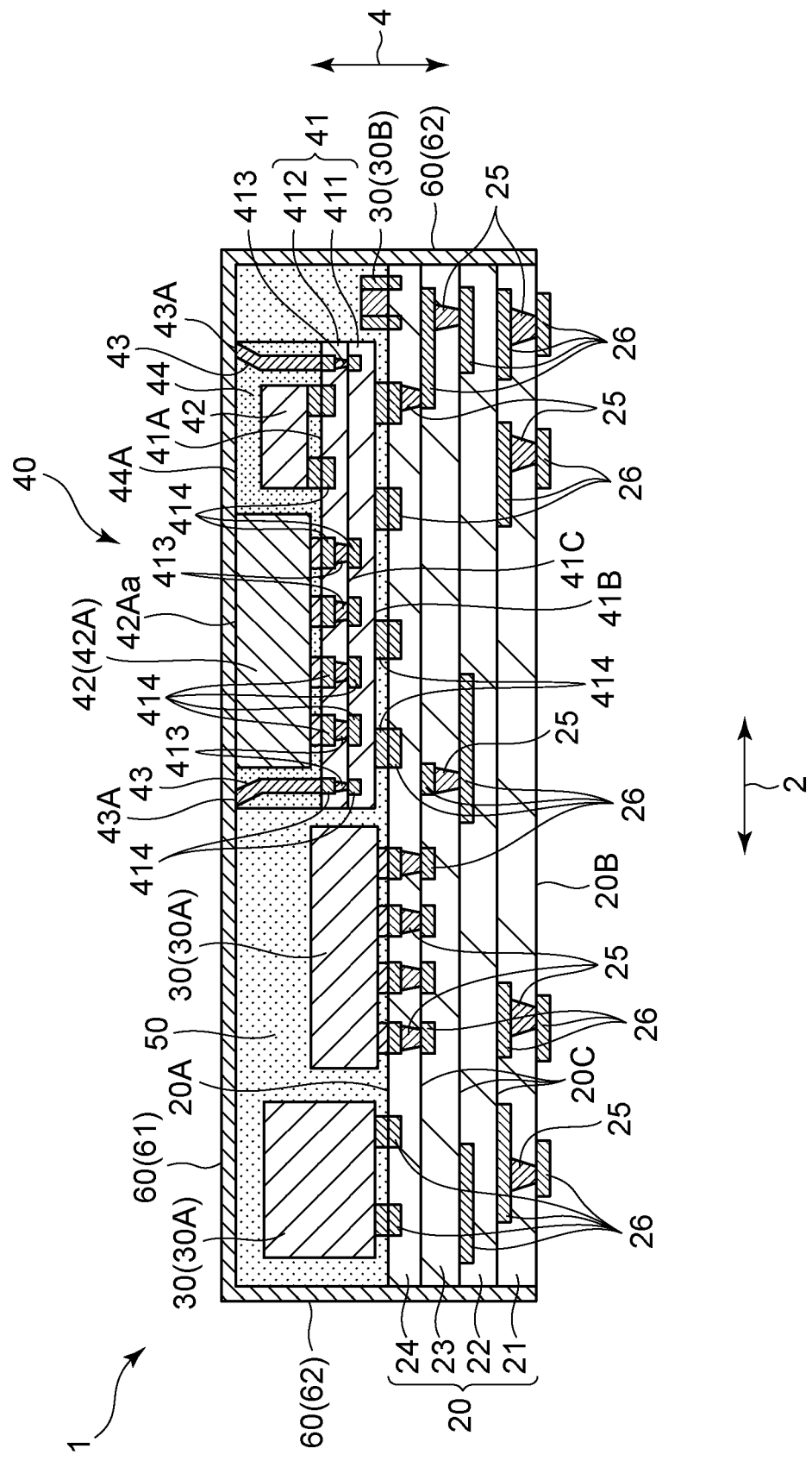
FIG. 2 is a cross-sectional view along line A-A in FIG. 1.

FIG. 1 is a plan view of a circuit module according to the first embodiment of the present disclosure. FIG. 2 is a cross-sectional view along line A-A in FIG. 1.

As illustrated in FIGS. 1 and 2, a circuit module 1 includes a main substrate 20, electronic parts 30, a submodule 40, a main sealing resin 50, and a shield film 60. Note that FIG. 1 and FIGS. 16, 18, 20, and 30 described later omit illustration of an upper film 61 of the shield film 60, the main sealing resin 50, and a subsealing resin 44.

The circuit module 1 has a rectangular parallelepiped shape as a whole. In the following description, directions of respective sides of the circuit module 1 having the rectangular parallelepiped shape are defined as a longitudinal direction 2, a lateral direction 3, and a height direction 4, respectively. A side on which the upper film 61 of the shield film 60 is located is defined as an upper side of the height direction 4. Note that the shape of the circuit module 1 is not limited to the rectangular parallelepiped shape.

The main substrate 20 is made of a resin such as glass epoxy, Teflon (registered trademark), and paper phenol, ceramic such as alumina, or the like.

In the first embodiment, as illustrated in FIG. 2, the main substrate 20 is a four-layer substrate on which four substrates 21, 22, 23, and 24 are stacked in order from a bottom. Note that the main substrate 20 may be a multilayer substrate including a number of layers other than four layers, or may be a single-layer substrate.

Via conductors 25 are formed in the main substrate 20. In the first embodiment, the plurality of via conductors 25 are formed in the main substrate 20. In the first embodiment, the via conductors 25 are formed in the substrates 21, 23, and 24. Note that the via conductors 25 may be formed in the substrate 22, or may not be formed in the substrates 21, 23, and 24. The via conductor 25 are formed by plating conductive metals made of copper or the like in through holes (vias) vertically penetrating the substrates 21, 22, 23, and 24 in a case of a resin substrate, or by filling the through holes with conductive pastes and cofiring the conductive pastes with a ceramic in a case of a ceramic substrate.

Wiring electrodes 26 are formed in the main substrate 20. In the first embodiment, the plurality of wiring electrodes 26 are formed in the main substrate 20. The wiring electrodes 26 are formed in a top surface 20A of the main substrate 20 (an upper surface of the substrate 24), a back surface 20B of the main substrate 20 (a lower surface of the substrate 21), and inner surfaces 20C sandwiched between two adjacent substrates of the substrates 21, 22, 23, and 24. In the case of the ceramic substrate, the wiring electrodes 26 are formed by printing conductive pastes and cofiring the conductive pastes with the ceramic substrate, and are made of, for example, copper. Alternatively, in the case of the resin substrate, the wiring electrodes 26 are formed on the respective surfaces (the top surface 20A, the back surface 20B, and the inner surfaces 20C) by known means such as etching of metal foils. Each wiring electrode 26 is electrically connected with another wiring electrode 26 via the via conductor 25. At least part of the wiring electrodes 26 formed on the back surface 20B of the main substrate 20 are terminal electrodes. In a case where the circuit module 1 is mounted on a substrate or the like (not illustrated), the terminal electrodes are connected to wiring electrodes formed on the substrate or the like.

As illustrated in FIG. 1, the plurality of electronic parts 30 are mounted on the top surface 20A of the main substrate 20. In the first embodiment, a plurality of large electronic parts 30A such as integrated circuits and a plurality of small electronic parts 30b such as resistors, capacitors, and transistors are respectively mounted. As illustrated in FIG. 2, each electronic part 30 is mounted on the wiring electrode 26 formed in the top surface 20A of the main substrate 20, and is connected to the wiring electrode 26.

Note that the electronic parts 30 may be mounted on the wiring electrodes 26 formed on the back surface 20B of the main substrate 20. Furthermore, the electronic parts 30 may not be mounted on the top surface 20A of the main substrate 20. Furthermore, the number of the electronic parts 30 is not limited to the number illustrated in FIG. 1. Furthermore, types of the electronic parts 30 are not limited to the above types (resistors and the like), and various known types of the electronic parts 30 can be mounted on the main substrate 20. Furthermore, in the first embodiment, all of the electronic parts 30 are a surface mounting type, yet are not limited thereto. For example, at least one of the electronic parts 30 may be an insert type. Furthermore, a method for mounting each electronic part 30 on each wiring electrode 26 can adopt various known mounting methods such as a flip chip.

As illustrated in FIGS. 1 and 2, the submodule 40 is mounted on the top surface 20A of the main substrate 20. Similarly to the electronic parts 30, the submodule 40 is connected to the wiring electrodes 26. In the first embodiment, the submodule 40 is connected to the wiring electrodes 26 via conductive members. The conductive member is, for example, solder, an adhesive containing copper or silver, or the like. Note that a method for connecting the submodule 40 to the wiring electrodes 26 can adopt other known connection methods such as solder connection. Furthermore, the one submodule 40 is mounted on the main substrate 20 in the first embodiment. However, a plurality of the submodules 40 may be mounted on the main substrate 20. That is, the circuit module 1 may include the plurality of submodules 40. A configuration of the submodule 40 will be described in detail later. Note that expression "sub" of the submodule 40 does not limit a function of the submodule 40 for the circuit module 1. For example, a main control IC of the circuit module 1 may be included in the submodule 40.

As illustrated in FIG. 2, the main sealing resin 50 is provided on the top surface 20A of the main substrate 20. The main sealing resin 50 is made of a resin such as an epoxy resin.

The main sealing resin 50 covers the electronic parts 30 and the submodule 40. In the first embodiment, each electronic part 30 is completely embedded in the main sealing resin 50. That is, all of the respective electronic parts 30 are covered with the main sealing resin 50. On the other hand, in the first embodiment, portions of the submodule 40 except an upper surface thereof are embedded in the main sealing resin 50. That is, part of the submodule 40 is covered with the main sealing resin 50.

Note that the main sealing resin 50 may cover only part of each electronic part 30. For example, while the small electronic parts 30b are completely embedded in the main sealing resin 50, portions of the large electronic parts 30a except upper surfaces thereof may be embedded in the main sealing resin 50. That is, the main sealing resin 50 may cover at least part of the plurality of respective electronic parts 30. Furthermore, the main sealing resin 50 may cover the entire submodule 40. For example, the submodule 40 may be completely embedded in the main sealing resin 50. That is, the main sealing resin 50 may cover at least part of the submodule 40.

As illustrated in FIG. 2, the shield film 60 is provided so as to cover the main substrate 20 and the main sealing resin 50 from above. As illustrated in FIG. 1, the shield film 60 surrounds the plurality of electronic parts 30 and the submodule 40 mounted on the main substrate 20 in plan view. The shield film 60 is made of a conductive member such as copper.

As illustrated in FIGS. 1 and 2, the shield film 60 includes the upper film 61 and side films 62. The side films 62 extend downward from peripheral edge parts of the upper film 61. That is, the shield film 60 has a box shape that is opened downward. The upper film 61 is in contact with an upper surface of the main sealing resin 50 and an upper surface of the submodule 40. That is, the upper film 61 covers an upper side of the main sealing resin 50 and an upper side of the submodule 40. The side films 62 are in contact with side surfaces of the main sealing resin 50 and side surfaces of the main substrate 20. That is, the side films 62 cover lateral sides of the main sealing resin 50 and lateral sides of the main substrate 20. As described above, the shield film 60 covers the lateral sides of the main substrate 20 and the lateral sides and the upper side of the main sealing resin 50.

Note that the shield film 60 may cover at least part of the main sealing resin 50. For example, the shield film 60 may not include the side films 62. In this case, the shield film 60 covers the upper side of the main sealing resin 50, yet does not cover the lateral sides of the main sealing resin 50.

Hereinafter, the configuration of the submodule 40 will be described in detail.

As illustrated in FIG. 2, the upper surface of the submodule 40 is covered with the upper film 61 of the shield film 60, and portions other than the upper surface are covered with the main sealing resin 50.

As illustrated in FIGS. 1 and 2, the submodule 40 includes a sub-substrate 41, the plurality of electronic parts 42, a plurality of conductive members 43, and the subsealing resin 44.

In the first embodiment, the sub-substrate 41 is smaller than the main substrate 20. Note that the sub-substrate 41 may have a size equal to or larger than that of the main substrate 20. Similarly to the main substrate 20, the sub-substrate 41 is made of a resin, ceramic, or the like. In the first embodiment, as illustrated in FIG. 2, the sub-substrate 41 is a two-layer substrate in which two substrates 411 and 412 are stacked in order from a bottom. Note that the sub-substrate 41 may be a multilayer substrate having a number of layers other than two layers, or may be a single-layer substrate.

Via conductors 413 are formed in the sub-substrate 41. The via conductors 413 employ the same configuration as that of the via conductors 25 formed in the main substrate 20. In the first embodiment, the plurality of via conductors 413 are formed in the sub-substrate 41. In the first embodiment, the via conductors 413 are formed in the substrate 412. Note that the via conductors 413 may be formed in the substrate 411, or may not be formed in the substrate 412.

Wiring electrodes 414 are formed on the sub-substrate 41. In the first embodiment, the plurality of wiring electrodes 414 are formed on the sub-substrate 41. The wiring electrodes 414 are formed on a top surface 41A of the sub-substrate 41 (an upper surface of the substrate 412), a back surface 41B of the sub-substrate 41 (a lower surface of the substrate 411), and an inner surface 41C sandwiched between the substrates 411 and 412. Similarly to the wiring electrodes 26, the wiring electrodes 414 are conductive pastes. The wiring electrodes 414 are printed on respective surfaces (the top surface 41A, the back surface 41B, and the inner surface 41C) by known means such as etching. Each wiring electrode 414 is electrically connected with the other wiring electrodes 414 via the via conductors 413. At least part of the wiring electrodes 414 formed on the back surface 41B of the sub-substrate 41 are terminal electrodes. In a state where the submodule 40 is mounted on the top surface 20A of the main substrate 20, the terminal electrodes are connected to the wiring electrodes 26 formed on the top surface 20A of the main substrate 20.

As illustrated in FIGS. 1 and 2, the three electronic parts 42 are mounted on the top surface 41A of the sub-substrate 41. Note that the number of the electronic parts 42 mounted on the top surface 41A of the sub-substrate 41 is not limited to three. That is, the at least one electronic part 42 may be mounted on the top surface 41A of the sub-substrate 41.

Similarly to the electronic parts 30 mounted on the top surface 20A of the main substrate 20, the electronic parts 42 of various sizes and types can be mounted on the top surface 41A of the sub-substrate 41. Furthermore, a mounting method of the electronic parts 42 can adopt various known mounting methods similarly to the mounting method of the electronic parts 30. Furthermore, the electronic parts 42 may be mounted on the wiring electrodes 414 formed on the back surface 41B of the sub-substrate 41. Furthermore, the electronic parts 42 may not be mounted on the top surface 41A of the sub-substrate 41.

The 24 conductive members 43 are mounted on the top surface 41A of the sub-substrate 41. Note that the number of the conductive members 43 mounted on the top surface 41A of the sub-substrate 41 is not limited to 24. The plurality of conductive members 43 may be mounted on the top surface 41A of the sub-substrate 41.

The conductive members 43 are conductive, and are made of, for example, aluminum, copper, or the like.

The conductive members 43 are linear members. In the first embodiment, the conductive members 43 are wires. Note that, although the conductive members 43 take such postures that distal end parts (upper end parts 43A) thereof are bent in FIG. 2, the postures of the conductive members 43 are not limited thereto. For example, the conductive members 43 may extend straight upward. Furthermore, the conductive members 43 may be bar-like members such as pins.

The conductive members 43 are connected to the top surface 41A of the sub-substrate 41 and the shield film 60. In the first embodiment, lower end parts of the conductive members 43 are connected to the wiring electrodes 414 formed on the top surface 41A of the sub-substrate 41, and the upper end parts 43A of the conductive members 43 are connected to the upper film 61 of the shield film 60. Note that portions other than the lower end parts of the conductive members 43 may be connected to the wiring electrodes 414, and portions other than the upper end parts 43A of the conductive members 43 may be connected to the upper film 61 of the shield film 60. Furthermore, the conductive members 43 may be connected to the side films 62 of the shield film 60.

As illustrated in FIG. 1, the plurality of conductive members 43 are disposed side by side at intervals. In the first embodiment, the plurality of conductive members 43 are disposed at equal intervals. Note that the plurality of conductive members 43 may be disposed at different intervals.

The plurality of conductive members 43 surround the electronic parts 42 in plan view. In the first embodiment, the plurality of conductive members 43 are disposed so as to surround four sides of the electronic parts 42 in plan view. Furthermore, in the first embodiment, the plurality of conductive members 43 are disposed so as to surround all of the electronic parts 42 mounted on the sub-substrate 41. However, the plurality of conductive members 43 may be disposed so as to surround only part of the electronic parts 42 mounted on the sub-substrate 41. For example, the plurality of conductive members 43 may be disposed so as to surround only the electronic part 42A disposed on a left side among the three electronic parts 42 mounted on the sub-substrate 41.

As illustrated in FIG. 2, the subsealing resin 44 is provided on the top surface 41A of the sub-substrate 41. Similarly to the main sealing resin 50, the subsealing resin 44 is made of a resin such as an epoxy resin.

The subsealing resin 44 covers at least part of each of the plurality of electronic parts 42, and part of each of the plurality of conductive members 43.

The subsealing resin 44 may completely cover all of the electronic parts 42, may partially cover all of the electronic parts 42, or may completely cover part of the electronic parts 42 and partially cover the rest of the electronic parts 42.

In the first embodiment, the two electronic parts 42 except the electronic part 42A among the three electronic parts 42 are completely embedded in the subsealing resin 44. On the other hand, portions of the electronic part 42A except an upper surface 42Aa thereof are embedded in the subsealing resin 44. That is, in the first embodiment, the subsealing resin 44 completely covers part of the electronic parts 42, and covers part of the remaining electronic parts 42A.

In the first embodiment, portions of all of the conductive members 43 except the upper end parts 43A thereof are embedded in the subsealing resin 44.

Here, the upper surface of the submodule 40 includes an upper surface 44A of the subsealing resin 44, the upper surface 42Aa of the electronic part 42A, and the upper end parts 43A of the conductive members 43. Furthermore, as described above, the upper surface of the submodule 40 is in contact with an upper film 61A of the shield film 60. That is, in the first embodiment, the upper end parts 43A of all of the conductive members 43 are connected with the upper film 61 of the shield film 60.

According to the first embodiment, it is possible to cover the submodule 40 with the conductive members 43 and the shield film 60. That is, part of the shield film 60 that functions as shields of the entire circuit module 1 can function as shields of the submodule 40. The conductive members 43 and the shield film 60 can individually cover the submodule 40, so that it is possible to enhance the shielding performance for the submodule 40.

Furthermore, according to the first embodiment, the conductive members 43 have the linear shapes or the bar shapes, so that it is possible to suppress an increase in the area of the sub-substrate 41 of the submodule 40 compared to the configuration where the conductive members 43 have wall shapes. Consequently, it is possible to suppress an increase in size of the circuit module 1.

Furthermore, according to the first embodiment, it is possible to shield the upper sides of the electronic parts 42 of the submodule 40 by the upper film 61, and shield the lateral sides of the electronic part 42 of the submodule 40 by the conductive members 43.

Furthermore, according to the first embodiment, the electronic parts 42 of the submodule 40 are surrounded by the plurality of conductive members 43, so that it is possible to enhance the shielding performance for the lateral sides of the electronic parts 42 of the submodule 40.

Arrangement positions of each electronic part 30 and the submodule 40 are not limited to arrangement positions illustrated in FIGS. 1 and 2.

First Manufacturing Method of Submodule According to First Embodiment

Hereinafter, the first manufacturing method of the submodule 40 included in the circuit module 1 according to the first embodiment will be described with reference to FIGS. 3 to 6.

Figure 3:
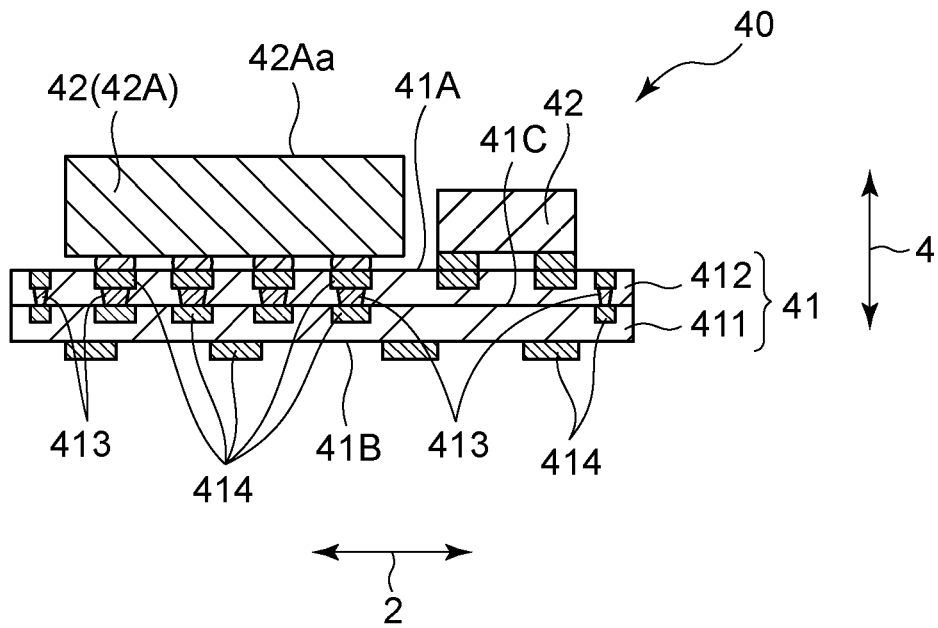
FIG. 3 is a cross-sectional view of a submodule in a state where electronic parts are mounted on a sub-substrate according to a first manufacturing method of the submodule of the circuit module according to the first embodiment of the present disclosure.
Figure 4:
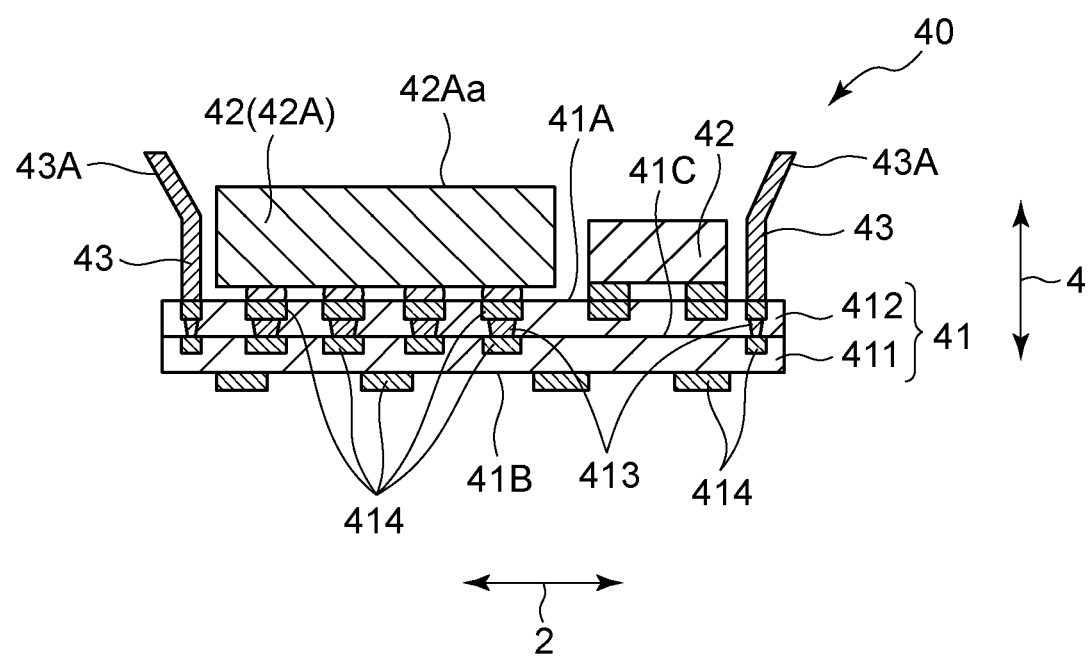
FIG. 4 is a cross-sectional view of the submodule in a state where the sub-substrate in FIG. 3 is connected with conductive members.
Figure 5:
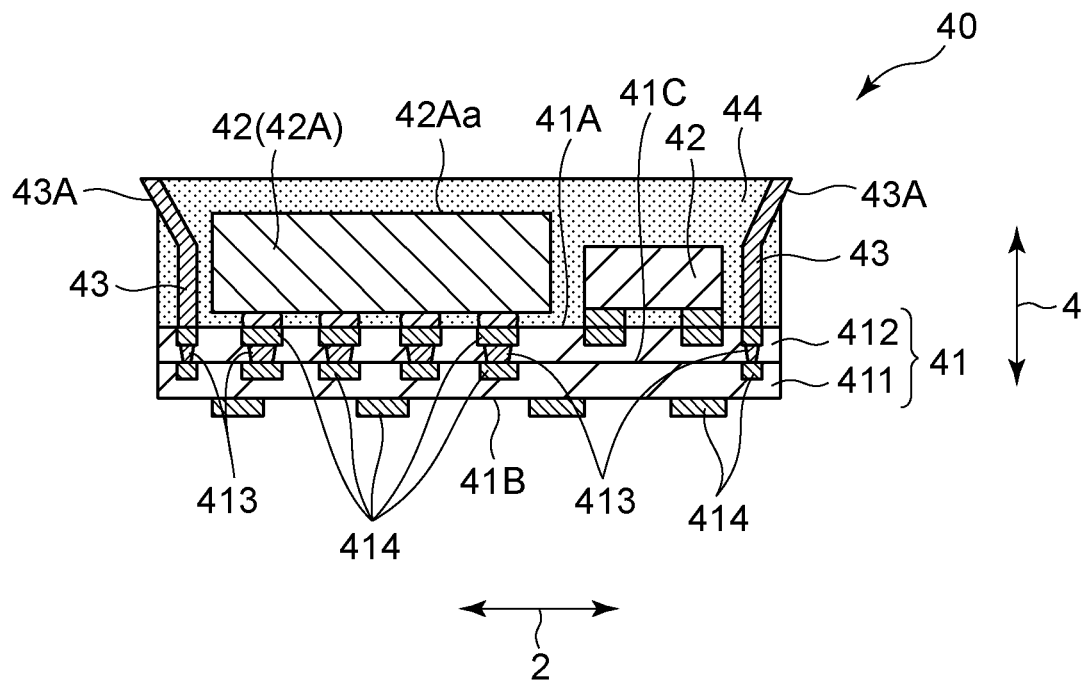
FIG. 5 is a cross-sectional view of the submodule in a state where the electronic parts and the conductive members in FIG. 4 are covered with a subsealing resin.
Figure 6:
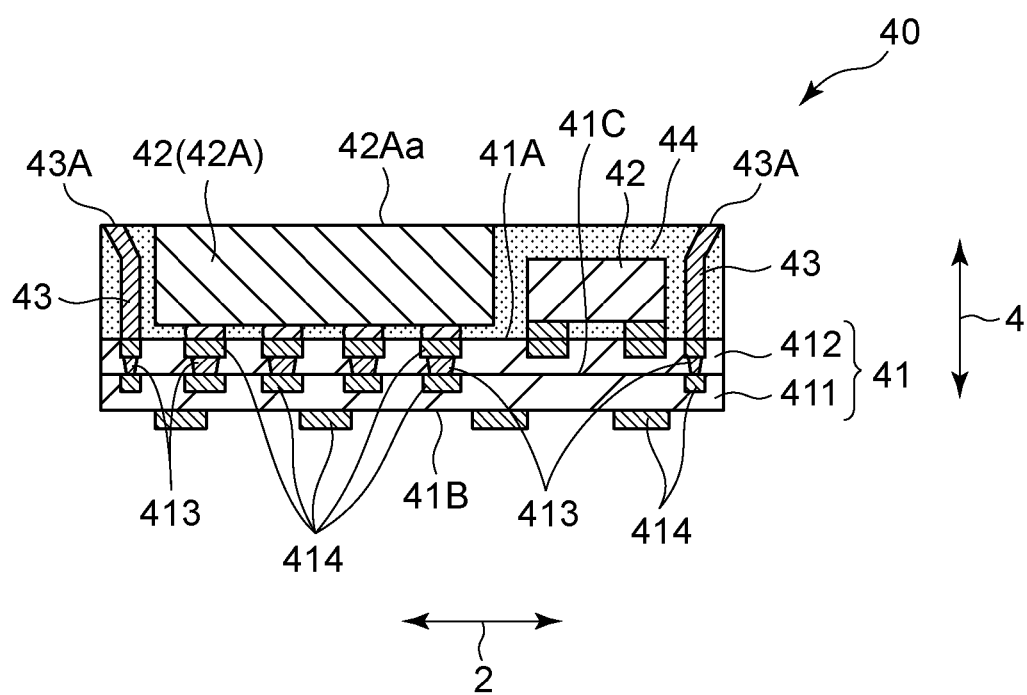
FIG. 6 is a cross-sectional view of the submodule in a state where an upper part of the subsealing resin in FIG. 5 is polished.

FIG. 3 is a cross-sectional view of the submodule in a state where the electronic parts are mounted on the sub-substrate according to the first manufacturing method of the submodule of the circuit module according to the first embodiment of the present disclosure. FIG. 4 is a cross-sectional view of the submodule in a state where the sub-substrate in FIG. 3 is connected with the conductive members. FIG. 5 is a cross-sectional view of the submodule in a state where the electronic parts and the conductive members in FIG. 4 are covered with the subsealing resin. FIG. 6 is a cross-sectional view of the submodule in a state where an upper part of the subsealing resin in FIG. 5 is polished.

First, a mounting process is executed. In the mounting step, as illustrated in FIG. 3, the electronic parts 42 are mounted on the two-layer sub-substrate 41 in which the via conductors 143 and the wiring electrodes 414 are formed. Each electronic part 32 is mounted on the wiring electrode 414 formed on the top surface 41A of the sub-substrate 41. The mounting method adopts various known mounting methods such as a flip chip and wire bonding. Note that the two-layer sub-substrate 41 is manufactured by known means.

Next, a connecting process is executed. In the connecting process, as illustrated in FIG. 4, the plurality of conductive members 43 having the linear shapes are connected to the wiring electrodes 414 formed on the top surface 41A of the sub-substrate 41. According to the first manufacturing method, one point (that is the lower end part of the conductive member 43 in FIG. 4, yet is not limited thereto) of each conductive member 43 is connected to the wiring electrode 414 by wire bonding.

Note that, although FIG. 4 illustrates the two conductive members 43, the number of the conductive members 43 connected to the sub-substrate 41 is not limited to two. When, for example, the submodule 40 illustrated in FIG. 1 is manufactured, the 24 conductive members 43 are connected to the sub-substrate 41. Furthermore, means for connecting the conductive members 43 to the wiring electrodes 414 may be performed by known means other than wire bonding. Furthermore, as described in the first embodiment, the conductive members 43 may have the bar shapes.

Next, a covering process is executed. In the covering process, as illustrated in FIG. 5, the electronic parts 42 mounted on the sub-substrate 41 in the mounting process and the plurality of conductive members 43 connected to the sub-substrate 41 in the connecting process are covered with the subsealing resin 44. The electronic parts 42 and the conductive members 43 are covered with the subsealing resin 44 by known means such as transfer molding or compression molding. In FIG. 5, all of the electronic parts 42 are completely embedded in the subsealing resin 44, and the distal end parts (upper end parts 43A) of the conductive members 43 are exposed outward. In the covering process of the first manufacturing method, the upper part of the subsealing resin 44 is polished and removed in the state in FIG. 5. Consequently, as illustrated in FIG. 6, the upper surface 42Aa of the electronic part 42A is exposed outward. Whether or not to expose the electronic parts 42 is optional.

Note that whether or not execute polishing is optional. In a case where polishing is not executed, the submodule 40 is manufactured in a state where all of the electronic parts 42 are completely embedded in the subsealing resin 44. On the other hand, when polishing is executed, the submodule 40 can be manufactured in a state where the upper surface 42Aa of the electronic part 42A is not covered with the subsealing resin 44. Furthermore, means for removing the upper part of the subsealing resin 44 is not limited to polishing, and can adopt various known means.

As described above, in the covering process, at least part of the electronic parts 42 are covered with the subsealing resin 44, and the plurality of conductive members 43 are covered with the subsealing resin 44 at such postures that at least the upper end part 43A of each of the plurality of conductive members 43 is exposed upward.

According to the first manufacturing method of the submodule 40 according to the first embodiment, the conductive members 43 are covered with the subsealing resin 44 in the covering process, so that it is possible to maintain the postures of the conductive members 43 as the postures at which the conductive members 43 extend upward from base end parts connected to the top surface 41A of the sub-substrate 41.

Furthermore, according to the first manufacturing method of the submodule 40 according to the first embodiment, the conductive members 43 take such postures that the upper end parts 43A thereof are exposed upward in the covering process, so that it is easy to connect the conductive members 43 to the shield film 60 when the upper side of the manufactured submodule 40 is shielded by the shield film 60.

Second Manufacturing Method of Submodule According to First Embodiment

Hereinafter, the second manufacturing method of the submodule 40 included in the circuit module 1 according to the first embodiment will be described with reference to FIGS. 7 to 10.

Figure 7:
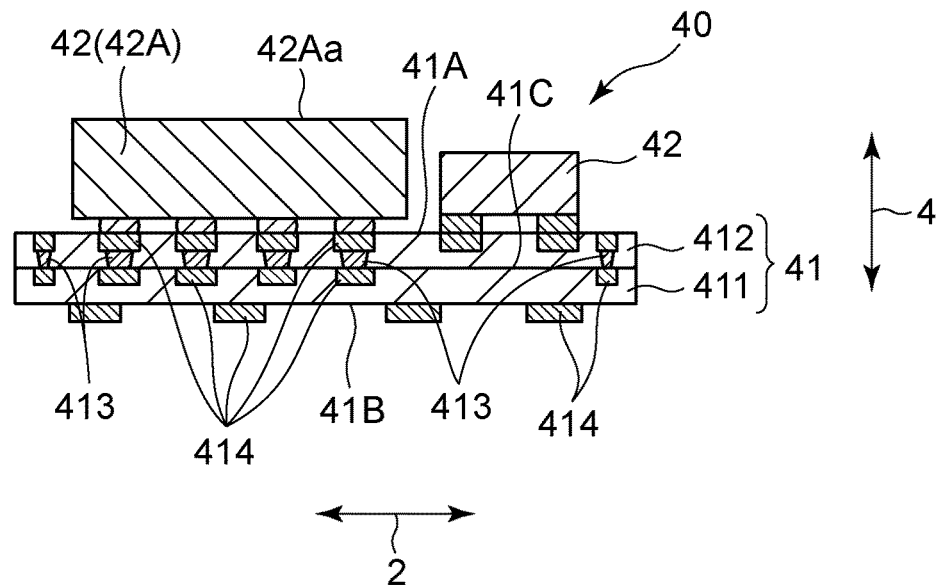
FIG. 7 is a cross-sectional view of the submodule in a state where the electronic parts are mounted on the sub-substrate according to a second manufacturing method of the submodule of the circuit module according to the first embodiment of the present disclosure.
Figure 8:
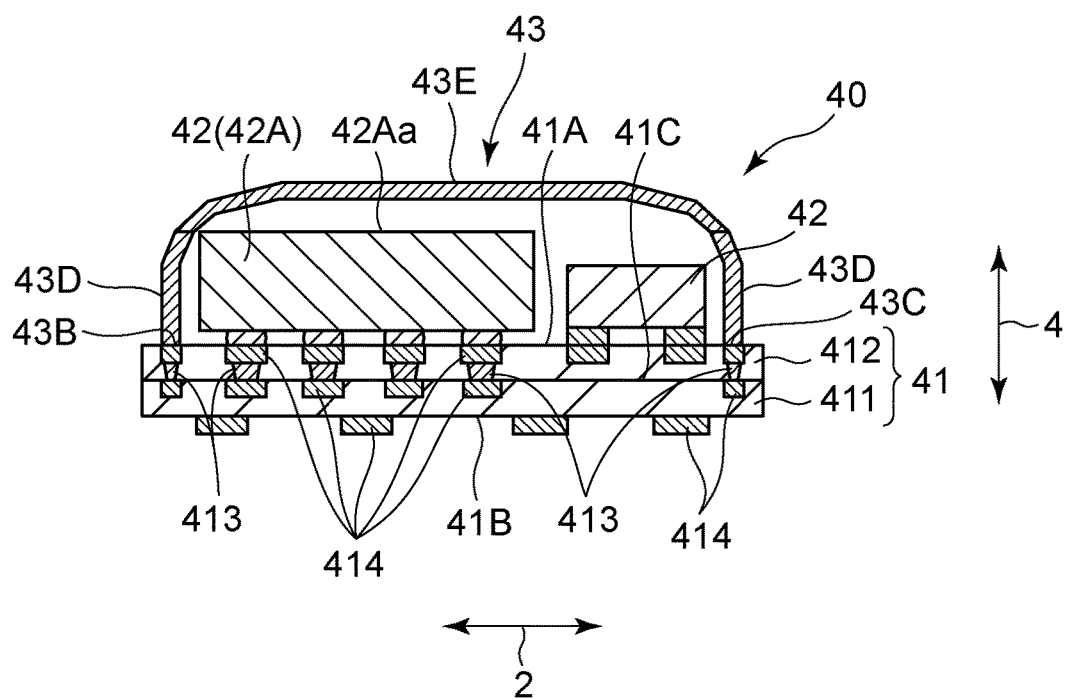
FIG. 8 is a cross-sectional view of the submodule in a state where the sub-substrate in FIG. 7 is connected with the conductive members.
Figure 9:
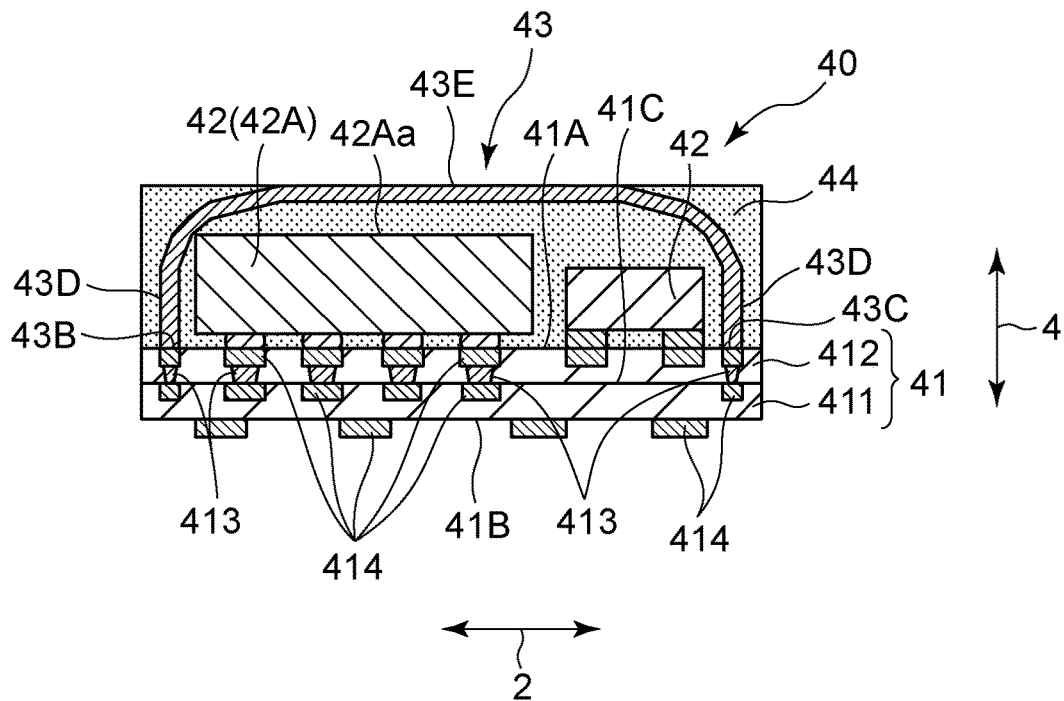
FIG. 9 is a cross-sectional view of the submodule in a state where the electronic parts and the conductive members in FIG. 8 are covered with the subsealing resin.

FIG. 7 is a cross-sectional view of the submodule in a state where the electronic parts are mounted on the sub-substrate according to the second manufacturing method of the submodule of the circuit module according to the first embodiment of the present disclosure. FIG. 8 is a cross-sectional view of the submodule in a state where the sub-substrate in FIG. 7 is connected with the conductive members. FIG. 9 is a cross-sectional view of the submodule in a state where the electronic parts and the conductive members in FIG. 8 are covered with the subsealing resin.

Figure 10:
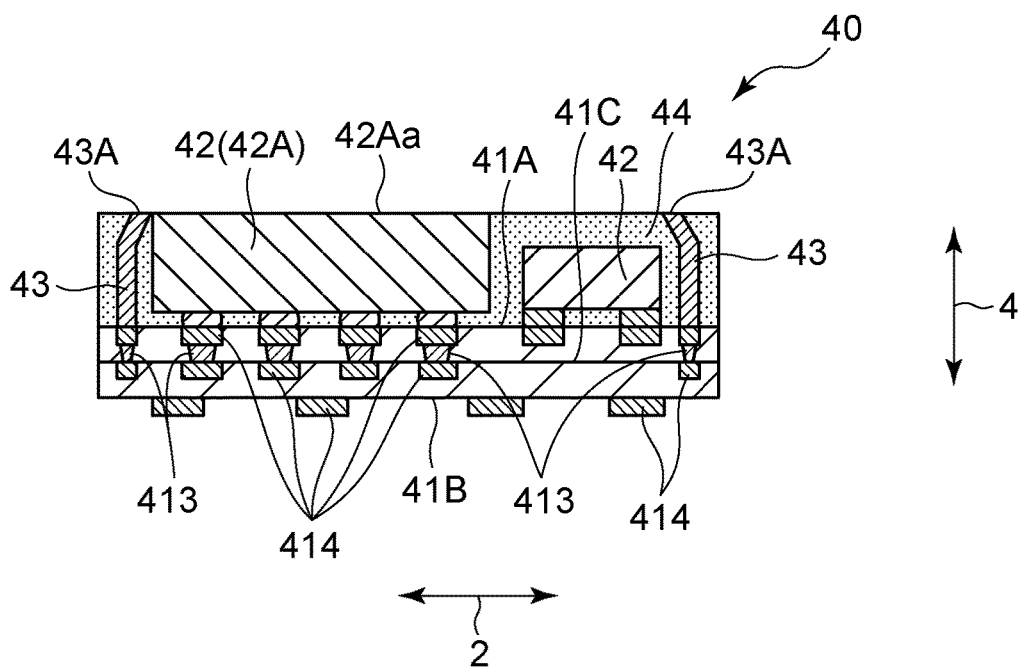
FIG. 10 is a cross-sectional view of the submodule in a state where an upper part of the subsealing resin in FIG. 9 is polished.

FIG. 10 is a cross-sectional view of the submodule in a state where the upper part of the subsealing resin in FIG. 9 is polished.

First, a mounting process is executed. The mounting process of the second manufacturing method is similar to the mounting process of the first manufacturing method. In the mounting process, as illustrated in FIG. 7, the electronic parts 42 are mounted on the sub-substrate 41.

Next, a connecting process is executed. In the connecting process, as illustrated in FIG. 8, the plurality of conductive members 43 having the linear shapes are connected to the wiring electrodes 414 formed on the top surface 41A of the sub-substrate 41. According to the second manufacturing method, two points of each conductive member 43 (a first end part 43B and a second end part 43C of the conductive member 43 in FIG. 8) are connected to the wiring electrode 414 by wire bonding. Consequently, each of the conductive members 43 connected to the wiring electrode 414 includes a pair of upward extending parts 43D and a top part 43E. One of the pair of upward extending parts 43D extends upward from the first end part 43B. The other one of the pair of upward extending parts 43D extends upward from the second end part 43C. The top part 43E is located between the pair of upward extending parts 43D. One end part of the top part 43E is connected with an upper end part of one of the pair of upward extending parts 43D, and the other end part of the top part 43E is connected with an upper end part of the other one of the pair of upward extending parts 43D. The top part 43E is located above the top surface 41A of the sub-substrate 41. In other words, the top part 43E vertically faces the top surface 41A of the sub-substrate 41.

Note that, although FIG. 8 illustrates the one conductive member 43, the number of the conductive members 43 connected to the sub-substrate 41 is not limited to one. When, for example, the submodule 40 illustrated in FIG. 1 is manufactured, the 12 conductive members 43 are connected to the sub-substrate 41. That is, the two arbitrary wiring electrodes 414 among the 24 wiring electrodes 414 form one set, and the one set is connected with the first end part 43B and the second end part 43C of the one conductive member 43. The two arbitrary wiring electrodes 414 are, for example, the two wiring electrodes 414 facing each other with the electronic part 42 interposed therebetween, or the two adjacent wiring electrodes 414.

Furthermore, portions of each conductive member 43 other than the first end part 43B and the second end part 43C may be connected to the wiring electrodes 414. Furthermore, similarly to the first manufacturing method, means for connecting the conductive members 43 to the wiring electrodes 414 may be performed by known means other than wire bonding.

Next, a covering process is executed. In the covering process, as illustrated in FIG. 9, the electronic parts 42 mounted on the sub-substrate 41 in the mounting process and the plurality of conductive members 43 connected to the sub-substrate 41 in the connecting process are covered with the subsealing resin 44. The electronic parts 42 and the conductive members 43 are covered with the subsealing resin 44 by known means such as transfer molding or compression molding.

Next, a removing process is executed. In the removing process, the upper part of the subsealing resin 44 is polished and removed. At this time, the subsealing resin 44 is polished up to a part below the top part 43E of the conductive member 43. Consequently, the top part 43E of the conductive member 43 is removed together with the subsealing resin 44. As a result, as illustrated in FIG. 10, each conductive member 43 is divided into the two conductive members 43 taking such postures that the conductive members 43 stand upward from the top surface 41A of the sub-substrate 41, and the distal end parts (upper end parts 43A) are exposed upward. Furthermore, by polishing the upper part of the subsealing resin 44, the upper surface 42Aa of the electronic part 42A is exposed upward. Note that the electronic parts 42 may or may not be exposed by polishing the upper part of the subsealing resin 44. Furthermore, means for removing the upper part of the subsealing resin 44 is not limited to polishing, and can adopt various known means.

According to the second manufacturing method of the submodule 40 according to the first embodiment, it is possible to easily connect the conductive members 43 to the sub-substrate 41 in the connecting process by known wire bonding.

Furthermore, according to the second manufacturing method of the submodule 40 according to the first embodiment, the removing process is executed, so that it is possible to create from the one conductive member 43 the two conductive members 43 that can shield the lateral sides of the electronic parts 42 of the submodule 40.

Third Manufacturing Method of Submodule According to First Embodiment

Hereinafter, the third manufacturing method of the submodule 40 included in the circuit module 1 according to the first embodiment will be described with reference to FIGS. 11 to 15.

Figure 11:
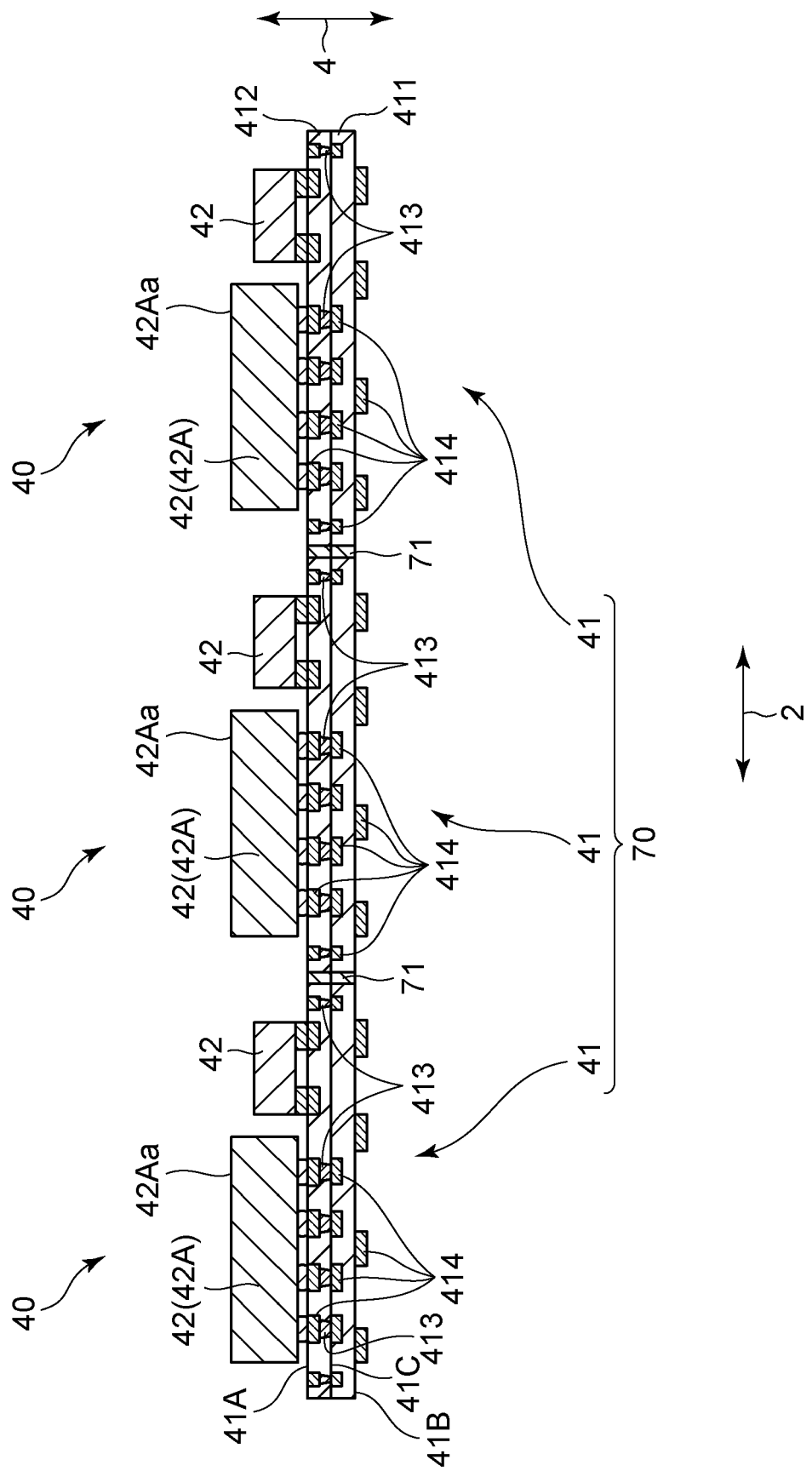
FIG. 11 is a cross-sectional view of the submodule in a state where electronic parts are mounted on a coupling substrate according to a third manufacturing method of the submodule of the circuit module according to the first embodiment of the present disclosure.
Figure 12:
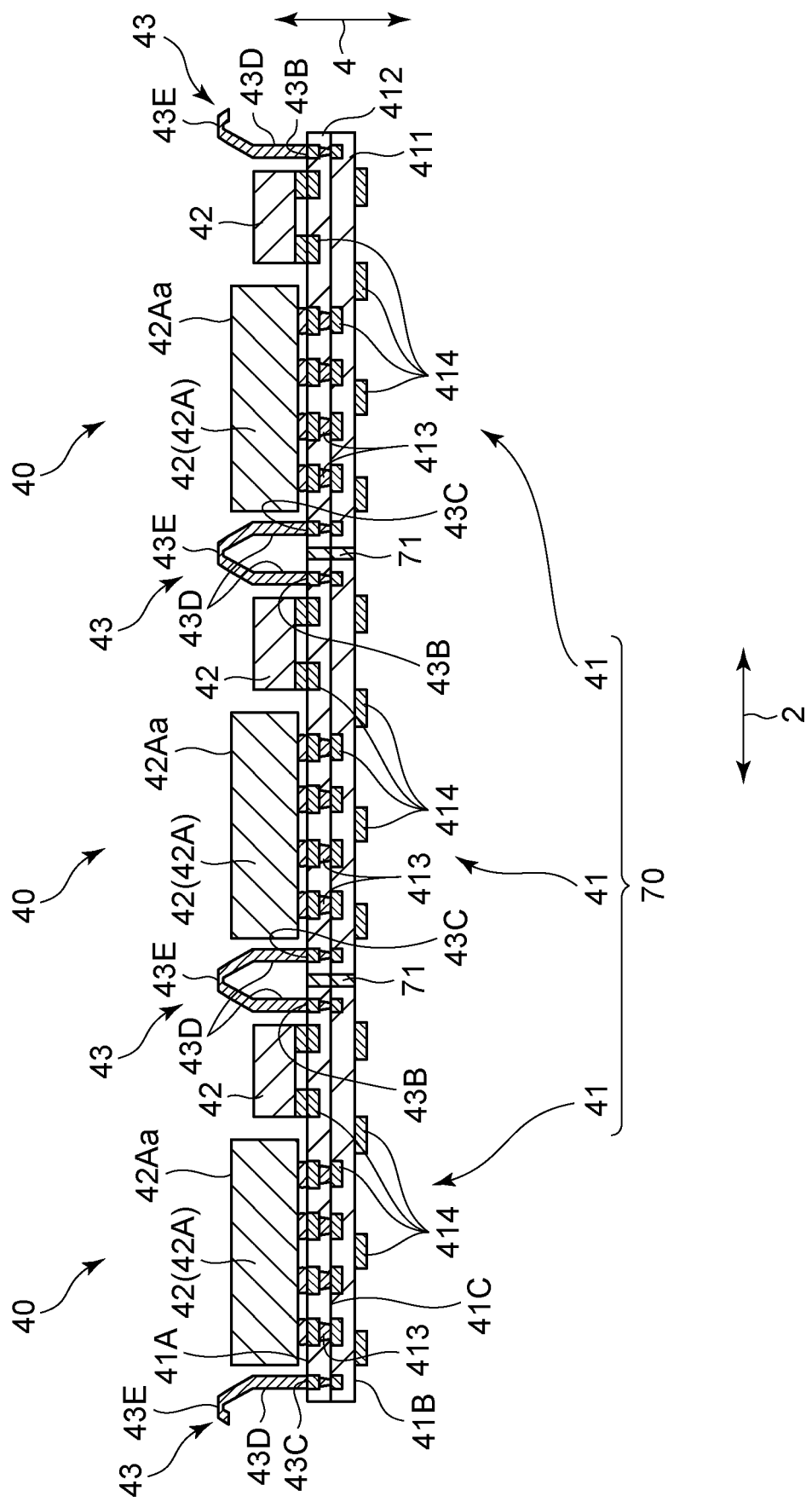
FIG. 12 is a cross-sectional view of the submodule in a state where the coupling substrate in FIG. 11 is connected with conductive members.
Figure 13:
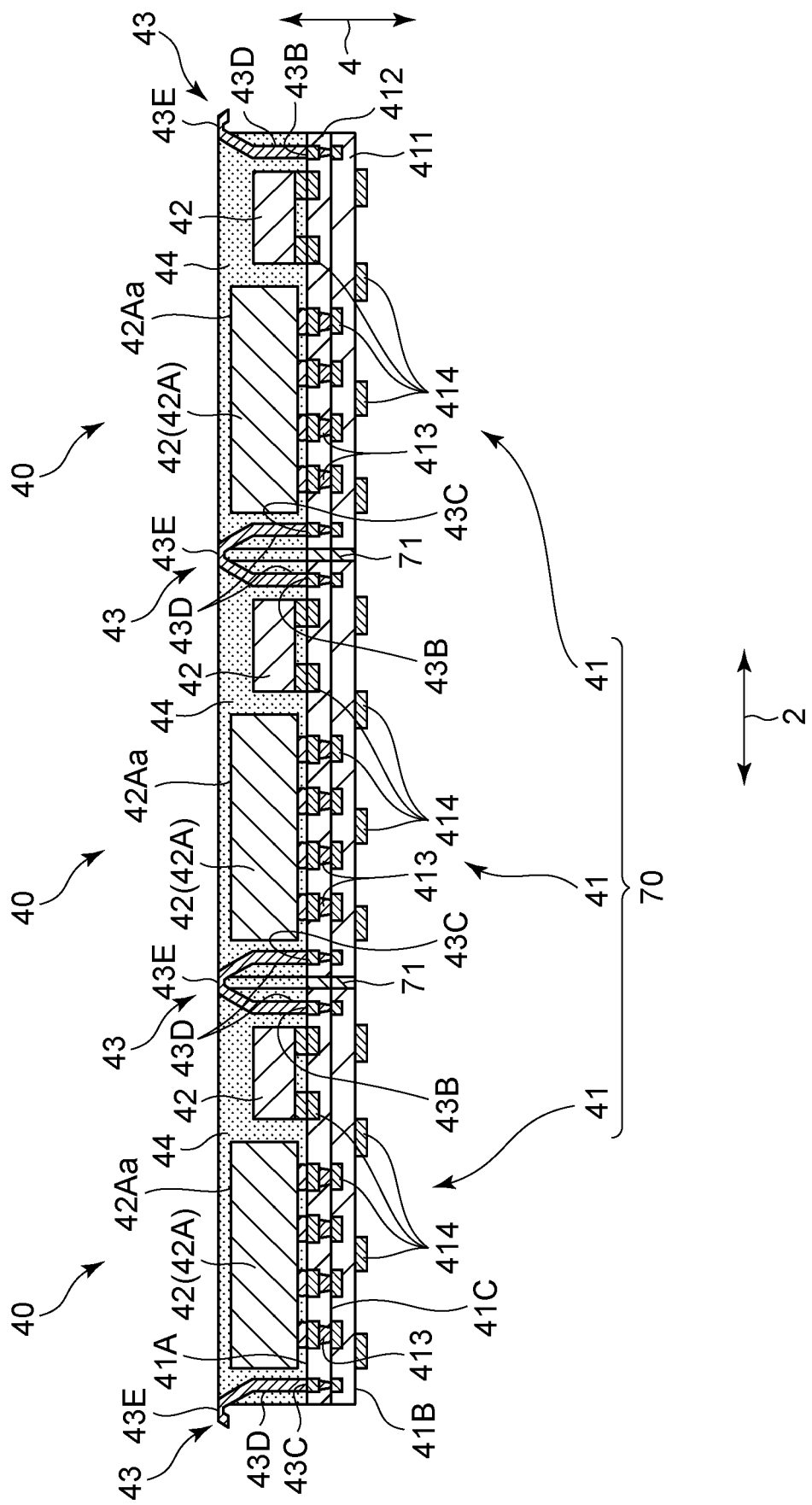
FIG. 13 is a cross-sectional view of the submodule in a state where the electronic parts and the conductive members in FIG. 12 are covered with a subsealing resin.
Figure 14:
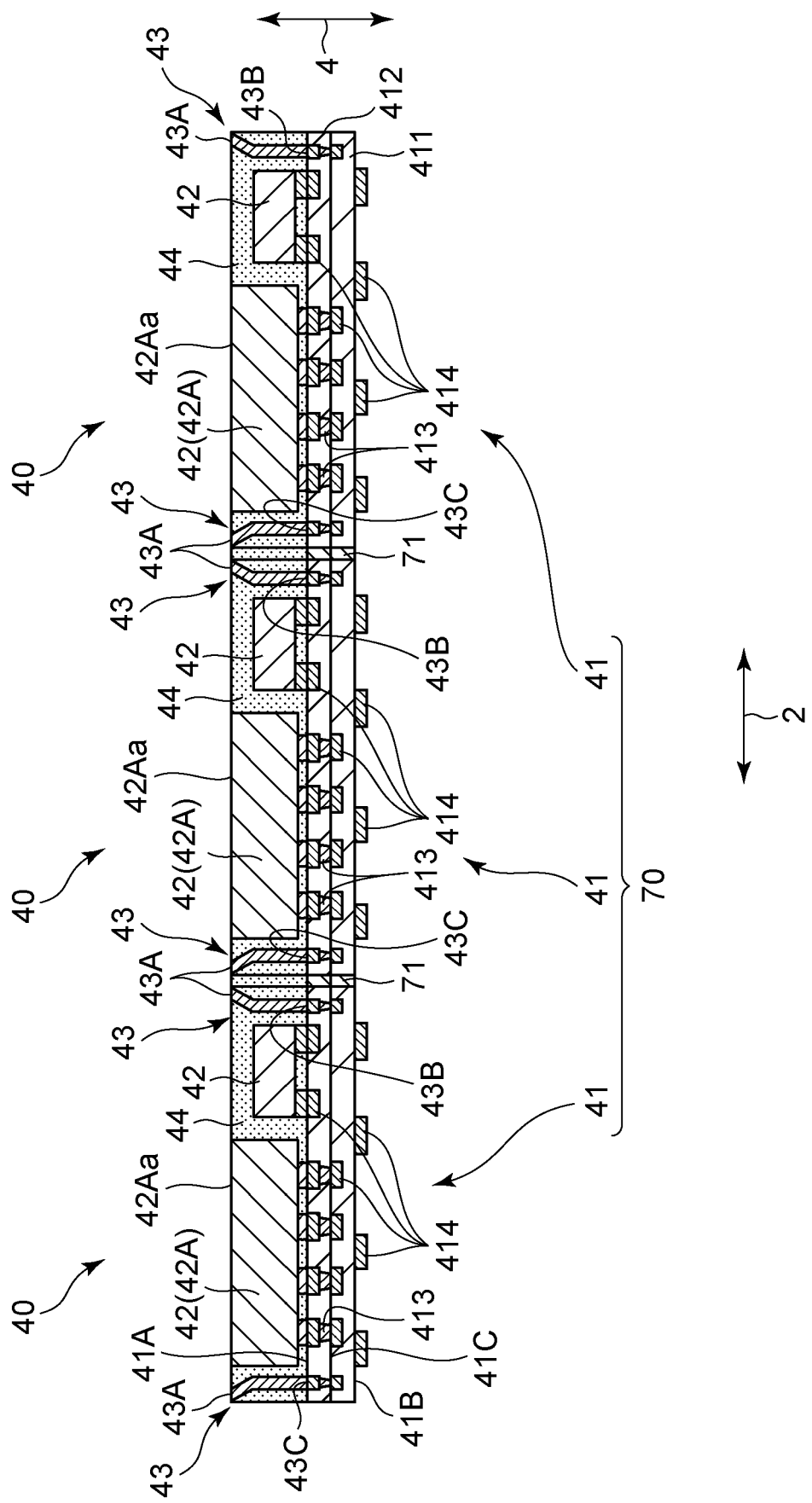
FIG. 14 is a cross-sectional view of the submodule in a state where an upper part of the subsealing resin in FIG. 13 is polished.
Figure 15:
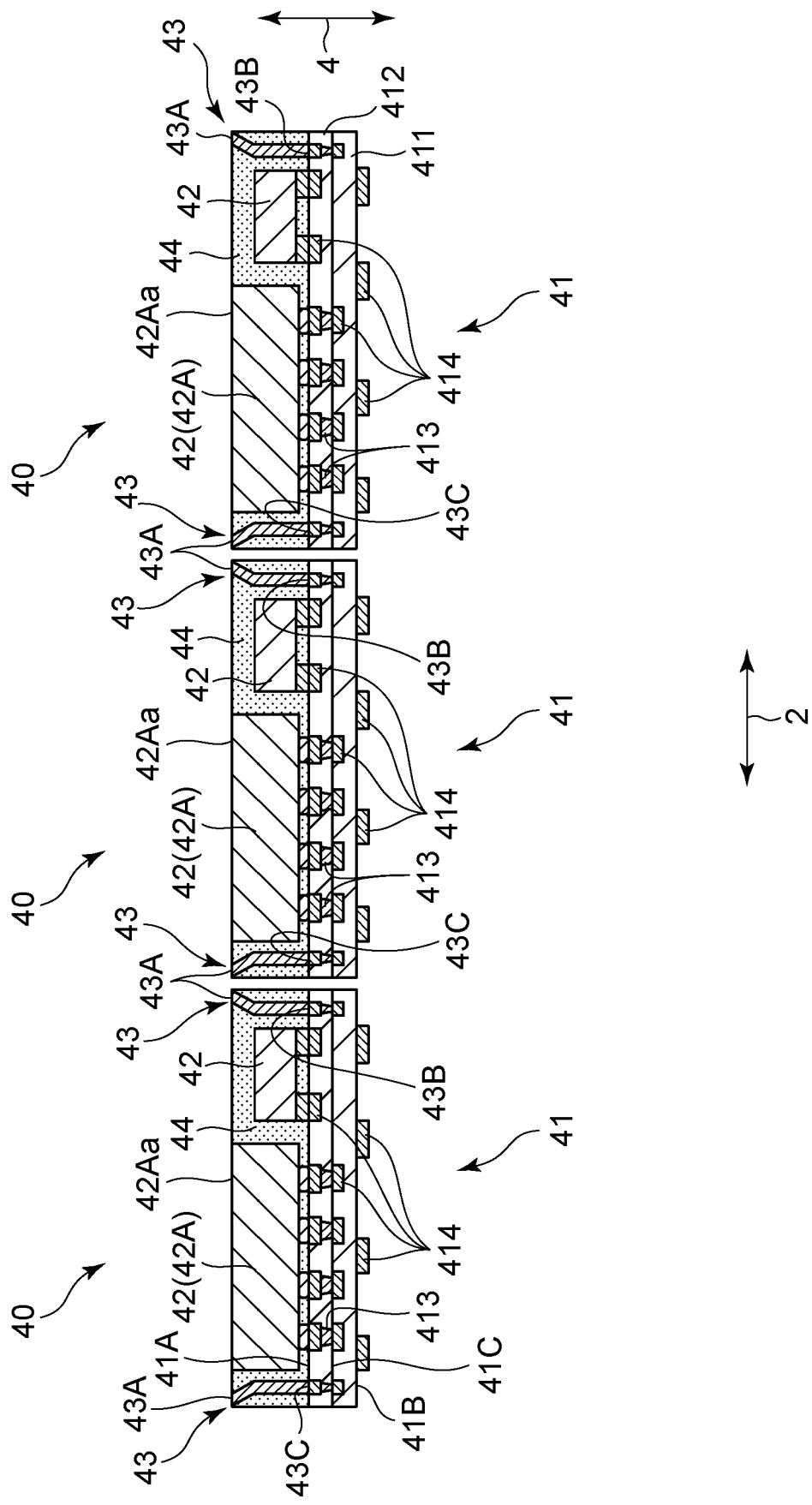
FIG. 15 is a cross-sectional view of the submodule in a state where the coupling substrate in FIG. 14 is divided into a plurality of sub-substrates.

FIG. 11 is a cross-sectional view of the submodule in a state where the electronic parts are mounted on a coupling substrate according to the third manufacturing method of the submodule of the circuit module according to the first embodiment of the present disclosure. FIG. 12 is a cross-sectional view of the submodule in a state where the coupling substrate in FIG. 11 is connected with the conductive members. FIG. 13 is a cross-sectional view of the submodule in a state where the electronic parts and the conductive members in FIG. 12 are covered with the subsealing resin. FIG. 14 is a cross-sectional view of the submodule in a state where the upper part of the subsealing resin in FIG. 13 is polished. FIG. 15 is a cross-sectional view of the submodule in a state where the coupling substrate in FIG. 14 is divided into a plurality of sub-substrates.

First, a mounting process is executed. In the mounting process of the third manufacturing method, as illustrated in FIG. 11, the electronic parts 42 are mounted on a coupling substrate 70.

The coupling substrate 70 is formed by integrating the plurality of sub-substrates 41 in a state where the top surfaces 41A of the plurality of sub-substrates 41 are aligned on the same plane. The coupling substrate 70 illustrated in FIG. 11 is formed by coupling the three sub-substrates 41 in a state where the three sub-substrates 41 are aligned along the longitudinal direction 2. Furthermore, although not illustrated, the plurality of sub-substrates 41 are coupled in a state where the sub-substrates 41 are aligned along the lateral direction 3. Note that the number of the sub-substrates 41 aligned along the longitudinal direction 2 and the number of the sub-substrates 41 aligned along the lateral direction 3 in the coupling substrate 70 are arbitrary. That is, the number of the sub-substrates 41 constituting the coupling substrate 70 is arbitrary.

A boundary part 71 is formed between the two adjacent sub-substrates 41. The boundary part 71 is removed in a substrate dividing process described later.

At least one electronic part 42 is mounted on each sub-substrate 41. Note that the number of electronic parts 42 mounted on each sub-substrate 41 may be the same number or different numbers.

Next, a connecting process is executed. In the connecting process, as illustrated in FIG. 12, the plurality of conductive members 43 having the linear shapes are connected to the wiring electrodes 414 formed on the top surfaces 41A of the sub-substrates 41 constituting the coupling substrate 70. According to the third manufacturing method, two portions of each conductive member 43 are connected to the different sub-substrates 41 by wire bonding. In FIG. 12, the first end part 43B of each conductive member 43 is connected to one of the two sub-substrates 41 adjacent in the longitudinal direction 2, and the second end part 43C of each conductive member 43 is connected to the other one of the two sub-substrates 41 adjacent in the longitudinal direction 2. The first end part 43B is an example of a first part. The second end part 43C is an example of a second part. In FIG. 12, one of the two sub-substrates 41 (the sub-substrate 41 located on a left side of the conductive member 43 in FIG. 12) to which the conductive member 43 is connected is an example of a first sub-substrate. Furthermore, in FIG. 12, the other one of the two sub-substrates 41 (the sub-substrate 41 located on a right side of the conductive member 43 in FIG. 12) to which the conductive member 43 is connected is an example of a second sub-substrate.

Thus, each conductive member 43 connected to the wiring electrode 414 of each sub-substrate 41 includes the pair of upward extending parts 43D and the top part 43E. One of the pair of upward extending parts 43D extends upward from the first end part 43B. The other one of the pair of upward extending parts 43D extends upward from the second end part 43C. The top part 43E is located between the pair of upward extending parts 43D. That is, the first end part 43B is located on one side of the top part 43E, and the second end part 43C is located on the other side of the top part 43E. One end part of the top part 43E is connected with an upper end part of one of the pair of upward extending parts 43D, and the other end part of the top part 43E is connected with an upper end part of the other one of the pair of upward extending parts 43D. The top part 43E is located above the top surface 41A of the sub-substrate 41. In other words, the top part 43E vertically faces the top surface 41A of the sub-substrate 41.

Note that the conductive members 43 connected to the coupling substrate 70 are not limited to those illustrated in FIG. 12. Similarly to the second manufacturing method, the two arbitrary wiring electrodes 414 of each conductive member 43 form one set, and the one set is connected with the first end part 43B and the second end part 43C of the one conductive member 43. According to the third manufacturing method, the two wiring electrodes 414 are formed on the different sub-substrates 41.

Furthermore, similarly to the second manufacturing method, portions of each conductive member 43 other than the first end part 43B and the second end part 43C may be connected to the wiring electrodes 414. Furthermore, similarly to the first manufacturing method and the second manufacturing method, means for connecting the conductive members 43 to the wiring electrodes 414 may be performed by known means other than wire bonding.

Next, a covering process is executed. In the covering process, as illustrated in FIG. 13, the electronic parts 42 mounted on the coupling substrate 70 in the mounting process and the plurality of conductive members 43 connected to the coupling substrate 70 in the connecting process are covered with the subsealing resin 44. The electronic parts 42 and the conductive members 43 are covered with the subsealing resin 44 by known means such as transfer molding or compression molding.

Next, a removing process is executed. In the removing process, the upper part of the subsealing resin 44 is polished and removed. At this time, the subsealing resin 44 is polished up to a part below the top part 43E of the conductive member 43. Consequently, the top part 43E of the conductive member 43 is removed together with the subsealing resin 44. As a result, as illustrated in FIG. 14, each conductive member 43 is divided into the two conductive members 43 taking such postures that the conductive members 43 stand upward from the top surface 41A of the sub-substrate 41, and the distal end parts (upper end parts 43A) are exposed upward. The conductive member 43 including the first end part 43B among the two conductive members 43 is an example of a first conductive member. The conductive member 43 including the second end part 43C among the two conductive members 43 is an example of a second conductive member. Furthermore, by polishing the upper part of the subsealing resin 44, the upper surface 42Aa of the electronic part 42A is exposed upward. Note that the electronic parts 42 may or may not be exposed by polishing the upper part of the subsealing resin 44. Furthermore, means for removing the upper part of the subsealing resin 44 is not limited to polishing, and can adopt various known means.

Next, a substrate dividing process is executed. In the substrate dividing process, as illustrated in FIG. 15, the coupling substrate 70 and the subsealing resin 44 are cut in the height direction 4 at the boundary parts 71. Consequently, the boundary parts 71 are removed. As a result, the one coupling substrate 70 is divided into the plurality of sub-substrates 41.

According to the third manufacturing method of the submodule according to the first embodiment, the removing process is executed, so that it is possible to create from the one conductive member 43 the two conductive members 43 that can shield the lateral sides of the electronic parts 42 of the submodule 40.

Second Embodiment

Figure 16:
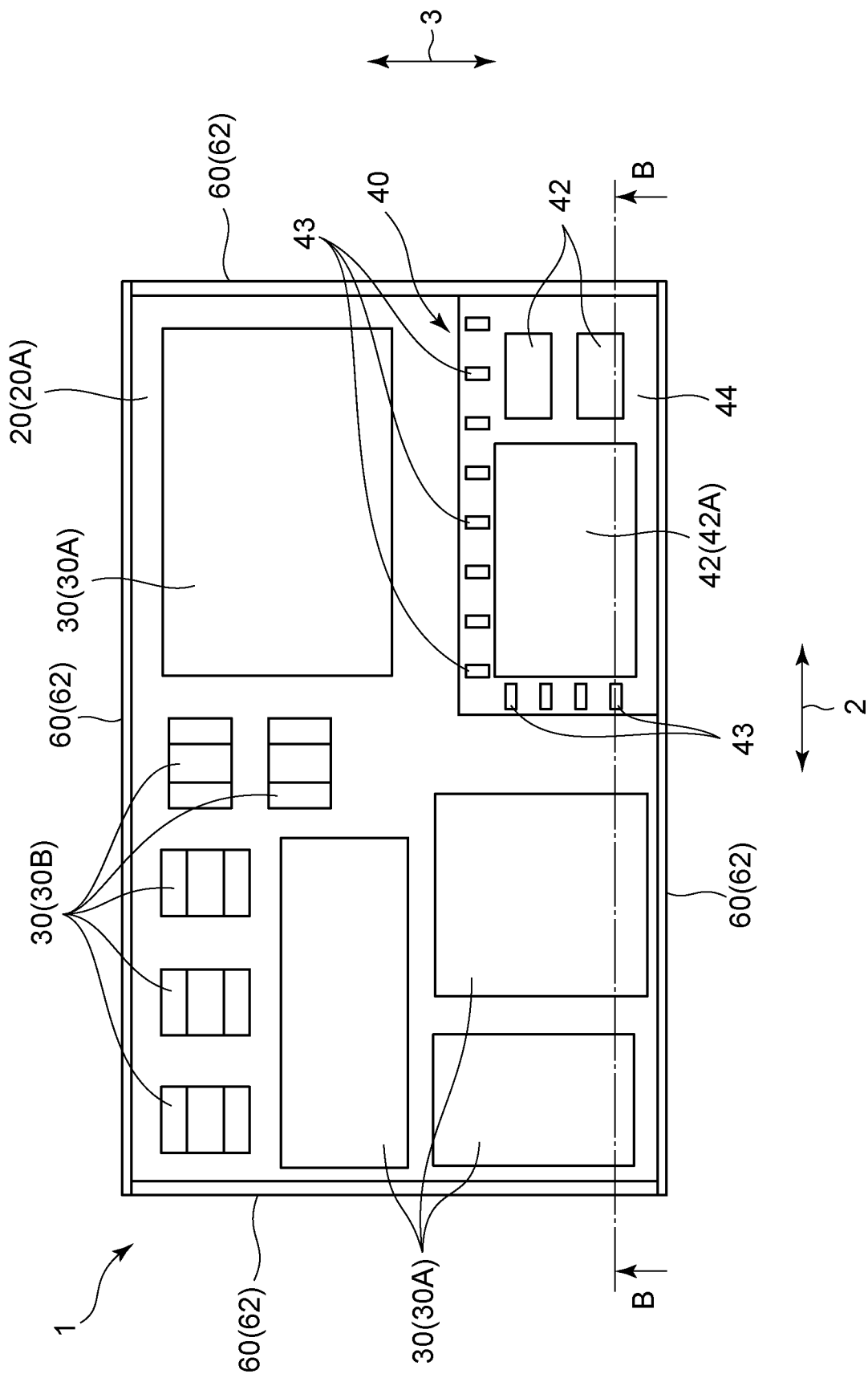
FIG. 16 is a plan view of a circuit module according to a second embodiment of the present disclosure.
Figure 17:
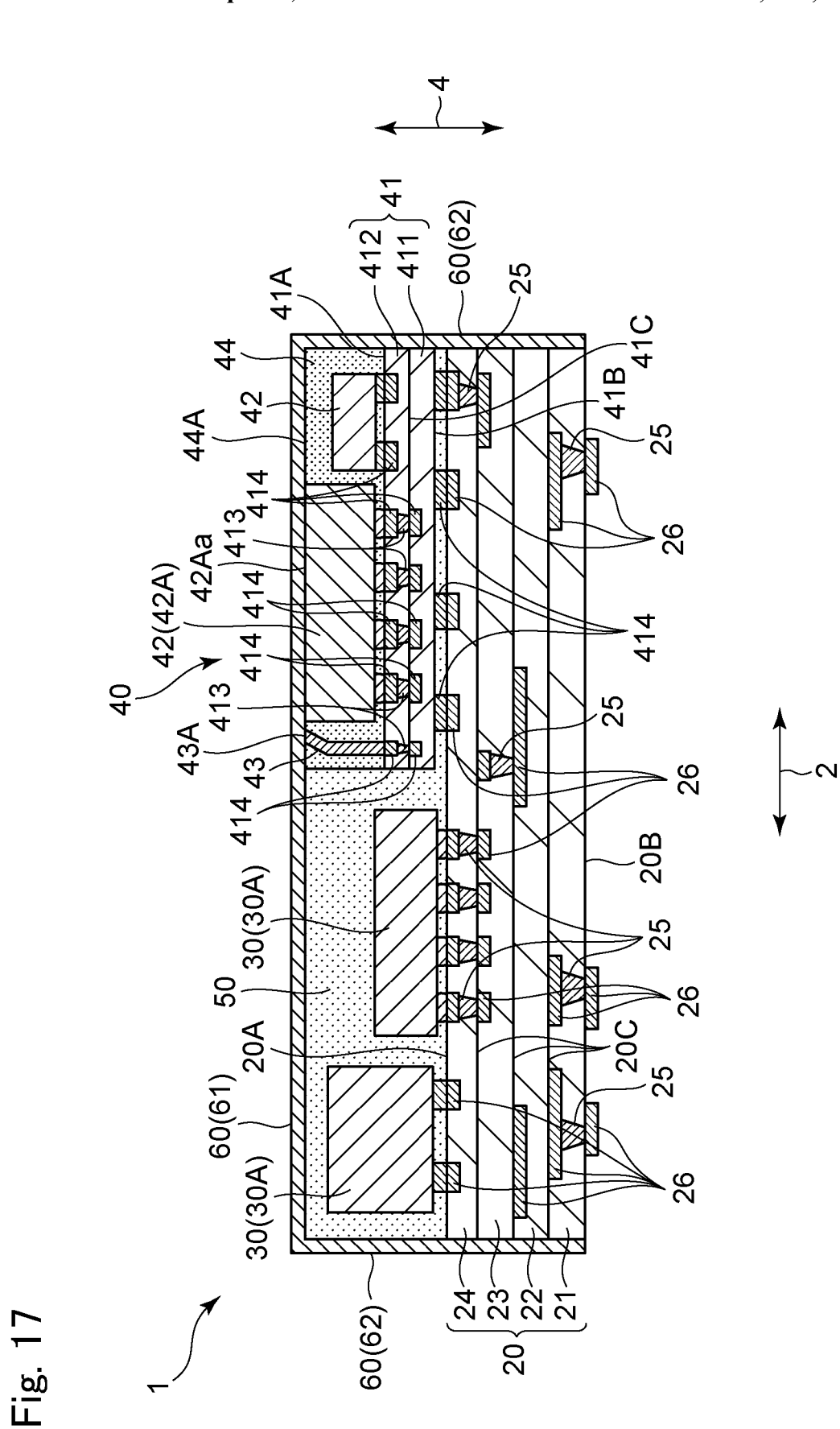
FIG. 17 is a cross-sectional view along line B-B in FIG. 16.

FIG. 16 is a plan view of a circuit module according to the second embodiment of the present disclosure. FIG. 17 is a cross-sectional view along line B-B in FIG. 16. A circuit module 1 according to the second embodiment differs from the circuit module 1 according to the first embodiment in that electronic parts 42 are surrounded by a plurality of conductive members 43 and side films 62 of a shield film 60 in plan view.

As illustrated in FIG. 16, the plurality of conductive members 43 are disposed so as to surround each of sides other than sides disposed along peripheral edge parts of a main substrate 20 among four sides of the electronic parts 42 in plan view. The plurality of conductive members 43 included in a submodule 40 according to the second embodiment are formed only in two directions (upper and left directions in FIG. 16) among four directions (upper, lower, left, and right directions in FIG. 16) around the electronic parts 42 in plan view. On the other hand, the side films 62 of the shield film 60 are provided in the rest of two directions (the lower and right directions in FIG. 16) among the four directions around the electronic parts 42 in plan view. Consequently, the electronic parts 42 are surrounded by the plurality of conductive members 43 and the side films 62 of the shield film 60 in plan view.

Note that an aspect where the plurality of conductive members 43 and the side films 62 of the shield film 60 surround the electronic parts 42 is not limited to an aspect illustrated in FIG. 16. For example, the plurality of conductive members 43 may be formed in the upper and lower directions in FIG. 16 around the electronic parts 42, and the side films 62 of the shield film 60 may be formed in the left and right directions in FIG. 16 around the electronic parts 42. Furthermore, for example, the plurality of conductive members 43 may be formed in three directions (e.g., the upper, lower, and left directions in FIG. 16) among the four directions around the electronic parts 42, and the side films 62 of the shield film 60 may be formed in one direction (e.g., the right direction in FIG. 16) among the four directions around the electronic parts 42.

According to the second embodiment, part of the side films 62 can function as shields that cover lateral sides of the electronic parts 42 of the submodule 40. Consequently, it is possible to enhance shielding performance for the submodule 40 while reducing the number of the conductive members 43 mounted on the sub-substrate 41. Furthermore, the number of the conductive members 43 mounted on the sub-substrate 41 is reduced, so that it is possible to miniaturize the sub-substrate 41.

Third Embodiment

Figure 18:
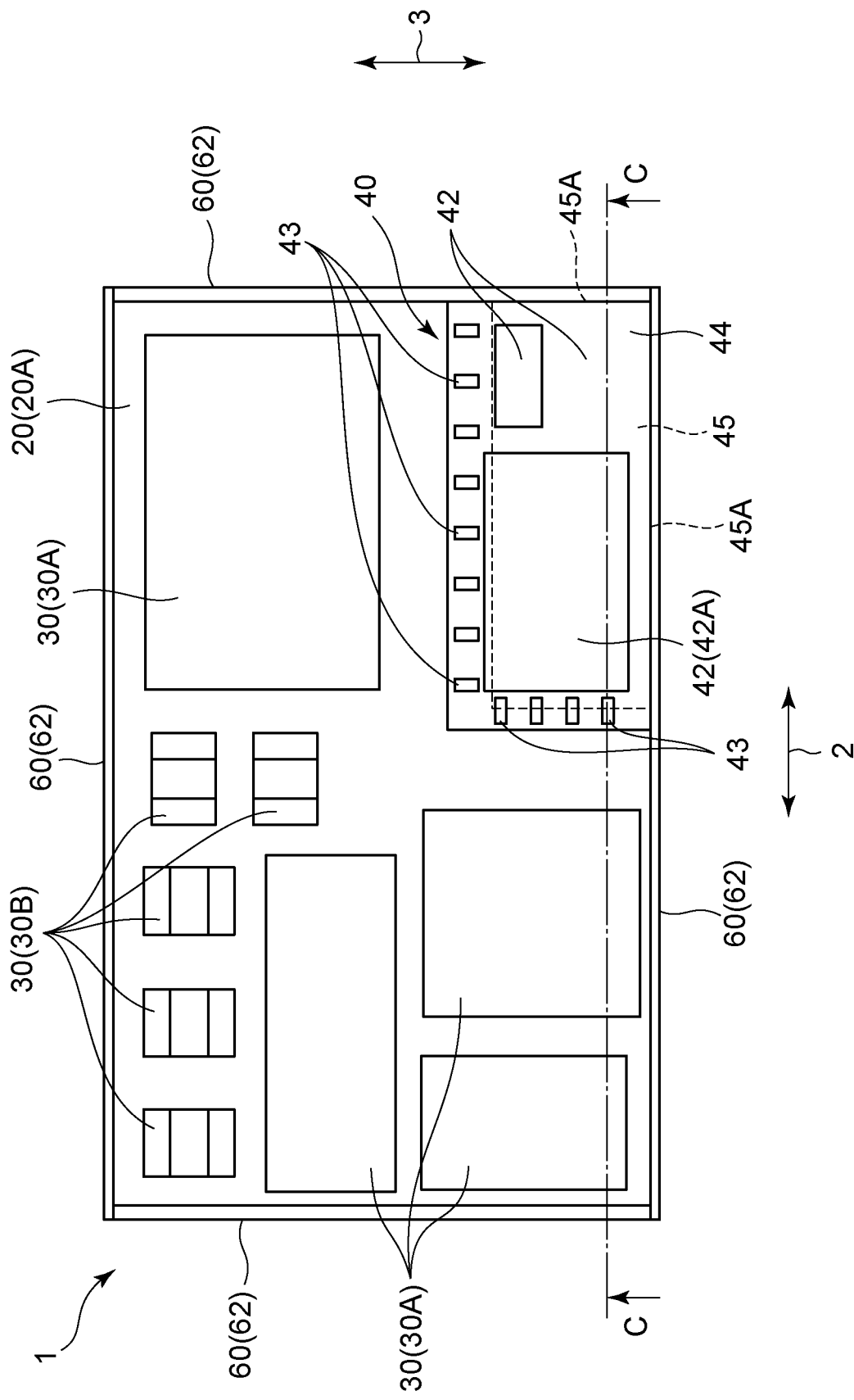
FIG. 18 is a plan view of a circuit module according to a third embodiment of the present disclosure.
Figure 19:
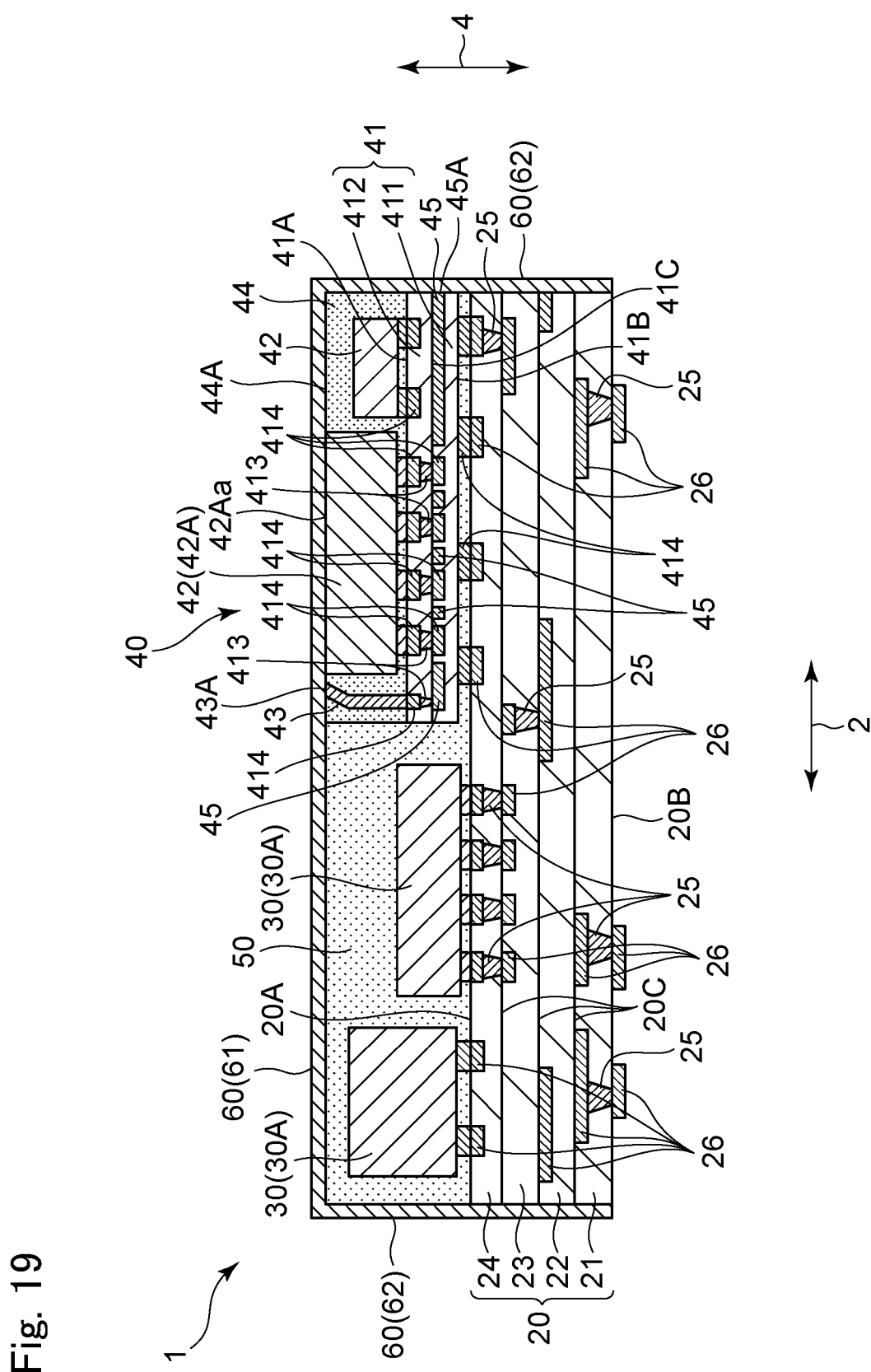
FIG. 19 is a cross-sectional view along line C-C in FIG. 18.

FIG. 18 is a plan view of a circuit module according to the third embodiment of the present disclosure. FIG. 19 is a cross-sectional view along line C-C in FIG. 18. A circuit module 1 according to the third embodiment differs from the circuit module 1 according to the first embodiment in that a sub-substrate 41 includes planar electrodes 45.

As illustrated in FIG. 19, the planar electrodes 45 are formed on an inner surface 41C sandwiched between substrates 411 and 412. Similarly to wiring electrodes 414, in the case of the ceramic substrate, the planar electrodes 45 are formed by printing conductive pastes and cofiring the conductive pastes with the ceramic substrate, and are made of copper or the like. Alternatively, in a case of a resin substrate, the planar electrodes 45 are formed on the inner surface 41C by known means such as etching of a metal foil.

As illustrated in FIG. 18, the planar electrodes 45 are formed on substantially an entire range of the inner surface 41C of the submodule 40. An opening is formed in the planar electrode 45 so as to avoid the wiring electrode 414. As illustrated in FIGS. 18 and 19, a side surface 45A located on an outer side of the circuit module 1 among the side surfaces of the planar electrode 45 is exposed from a lateral side of the submodule 40. The side surface 45A is connected with side films 62 of a shield film 60. That is, the planar electrodes 45 are connected with the shield film 60 that is a ground potential.

The planar electrode 45 is conducted with each conductive member 43 via the wiring electrode 414 formed on the inner surface 41C, a via conductor 413, and the wiring electrode 414 formed on a top surface 41A. Note that each conductive member 43 may be conducted with the planar electrode 45 via another conductive member 43. As described above, each conductive member 43 is connected with an upper film 61 of the shield film 60, and is also connected with the side films 62 of the shield films 60. Consequently, noise generated from electronic parts 42 mounted on a submodule 40 is suppressed from reaching wiring electrodes 26 of a main substrate 20 and electronic parts 30 mounted on the main substrate 20.

As illustrated in FIG. 18, part of the planar electrodes 45 overlap the electronic parts 42 in plan view.

Part of the planar electrodes 45 are formed in two directions (the lower and right directions in FIG. 18) among the four directions (the upper, lower, left, and right directions in FIG. 18) around the electronic parts 42 in plan view. On the other hand, similarly to the second embodiment illustrated in FIG. 16, the plurality of conductive members 43 are provided in the rest of two directions (the upper and left directions in FIG. 18) among the four directions around the electronic parts 42 in plan view. Consequently, the electronic parts 42 are surrounded by the planar electrodes 45 and the plurality of conductive members 43 in plan view.

According to the third embodiment, the conductive members 43, and, in addition, the planar electrodes 45 conducted with the conductive members 43 are connected with the shield film 60. By increasing the number of portions to be connected with the shield film 60 in this manner, it is possible to enhance reference potentials of grounds or the like in the shield film 60 and the conductive members 43.

Furthermore, according to the third embodiment, the planar electrode 45 can function as shields of lateral sides of the electronic parts 42 of the submodule 40. Consequently, it is possible to enhance the shielding performance for the submodule 40 while reducing the number of conductive members 43 mounted on the sub-substrate 41. Furthermore, the number of the conductive members 43 mounted on the sub-substrate 41 is reduced, so that it is possible to miniaturize the sub-substrate 41.

Furthermore, according to the third embodiment, the planar electrode 45 can function as the shields of lower sides of the electronic parts 42 of the submodule 40. Consequently, it is possible to enhance the shielding performance for the submodule 40.

Positions of the planar electrodes 45 are not limited to positions illustrated in FIGS. 18 and 19. For example, the planar electrodes 45 may be formed on the top surface 41A or a back surface 41B of the sub-substrate 41. Furthermore, for example, the planar electrodes 45 may be formed only at an outer circumferential part of the submodule 40, or may be formed on the entire inner surface 41C of the sub-substrate 41.

The electronic parts 42 may not be surrounded by the planar electrodes 45 and the plurality of conductive members 43 in plan view. That is, the planar electrodes 45 may be located at such positions that the electronic parts 42 are not surrounded by the planar electrodes 45 and the plurality of conductive members 43.

Portions at which the planar electrodes 45 and the electronic parts 42 overlap in plan view are not limited to the portions illustrated in FIG. 18. For example, the planar electrodes 45 may overlap only the electronic part 42A in plan view. Furthermore, for example, in plan view, all of the planar electrodes 45 may overlap part of the electronic parts 42, part of the planar electrodes 45 may overlap all of the electronic parts 42, or all of the planar electrode 45 may overlap all of the electronic parts 42. That is, at least part of the planar electrodes 45 may overlap at least part of the electronic parts 42 in plan view.

The planar electrodes 45 may not overlap the electronic parts 42 in plan view. Note that the planar electrodes 45 are also applicable to the circuit module 1 according to the other embodiments.

Fourth Embodiment

Figure 20:
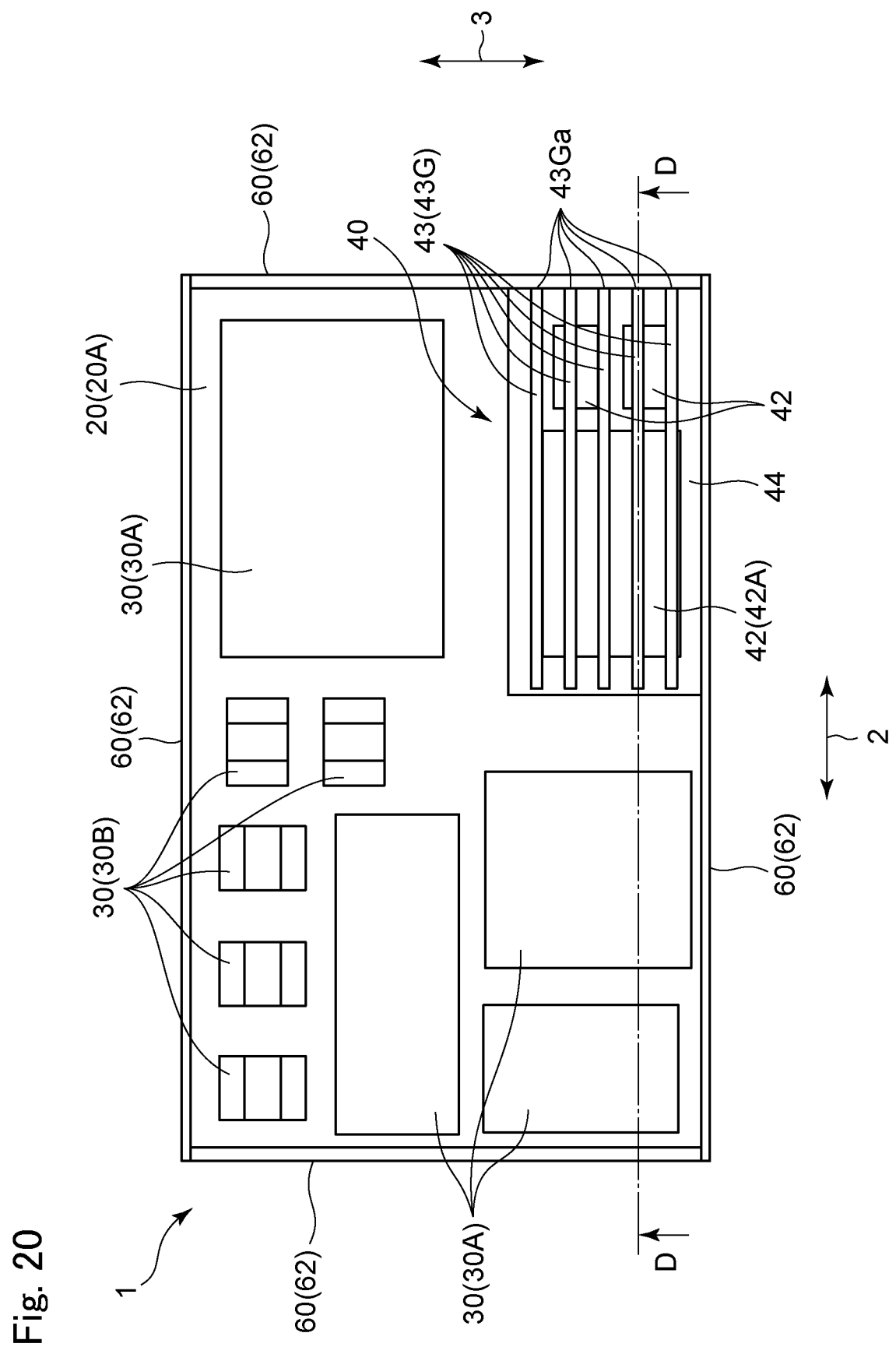
FIG. 20 is a plan view of a circuit module according to a fourth embodiment of the present disclosure.
Figure 21:
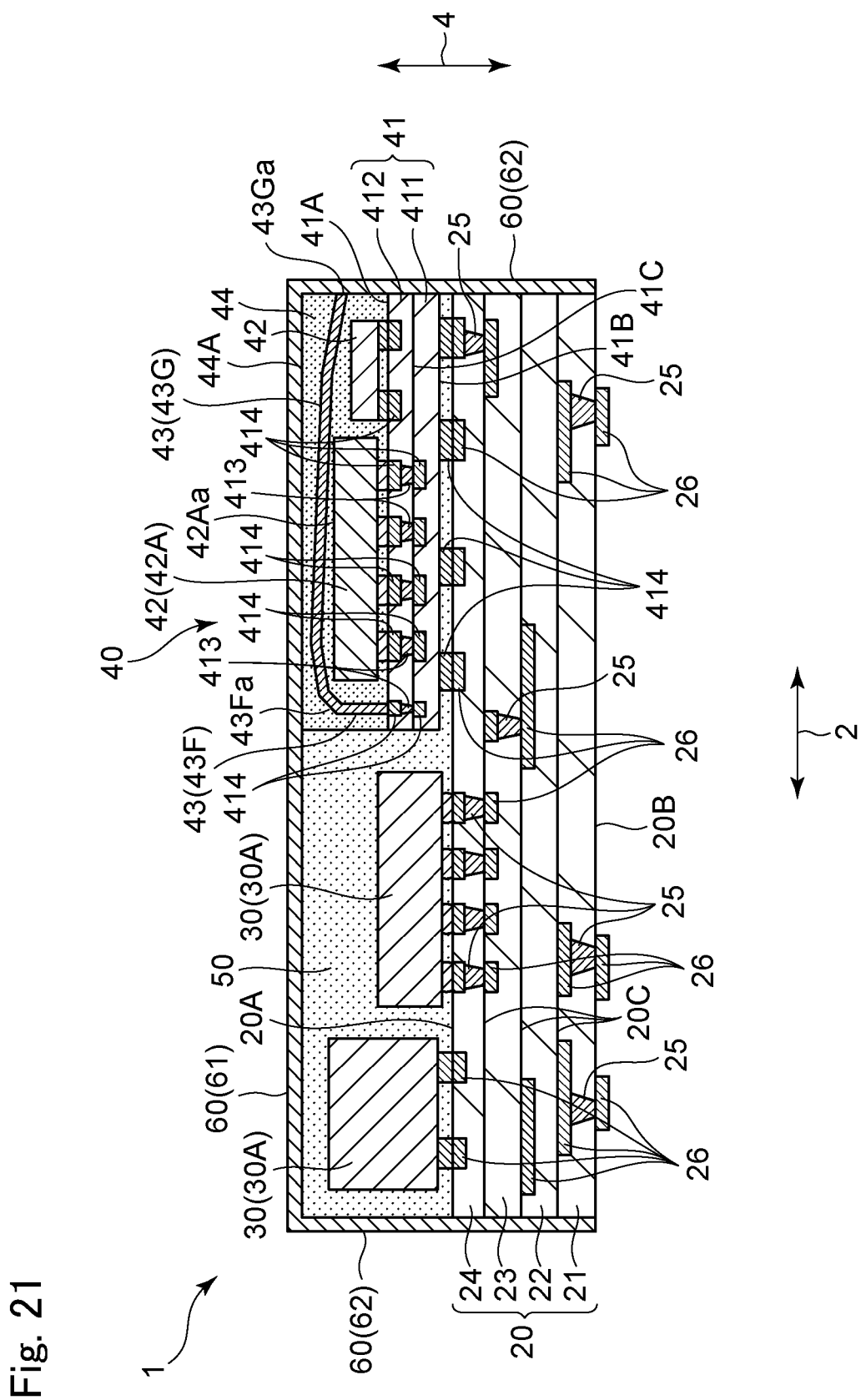
FIG. 21 is a cross-sectional view along line D-D in FIG. 20.

FIG. 20 is a plan view of a circuit module according to the fourth embodiment of the present disclosure. FIG. 21 is a cross-sectional view along line D-D in FIG. 20. A circuit module 1 according to the fourth embodiment differs from the circuit module 1 according to the first embodiment in that a plurality of conductive members 43 include laterally extending parts 43G that laterally extend.

As illustrated in FIG. 21, each conductive member 43 includes an upward extending part 43F and the laterally extending part 43G.

Each upward extending part 43F extends upward from a top surface 41A of a sub-substrate 41. In the fourth embodiment, each upward extending part 43F is provided on a side (a left end part of a submodule 40 in FIG. 20) opposite to a side film 62 of a shield film 60 for electronic parts 42 in the submodule 40.

Each laterally extending part 43G extends laterally (a right side in FIG. 20) from a distal end part 43Fa of each upward extending part 43F. That is, each conductive member 43 is bent at the distal end part 43Fa of the upward extending part 43F. Each laterally extending part 43G extends toward the side film 62 of the shield film 60. A distal end part 43Ga of each laterally extending part 43G is connected with the side film 62 of the shield film 60.

As illustrated in FIG. 21, each laterally extending part 43G passes directly above the electronic parts 42. Thus, as illustrated in FIG. 20, part of each laterally extending part 43G overlaps part of the electronic parts 42 in plan view.

According to the fourth embodiment, it is possible to shield lateral sides of the electronic parts 42 of the submodule 40 by the upward extending parts 43F of the conductive members 43, and shield upper sides of the electronic parts 42 of the submodule 40 by the laterally extending parts 43G of the conductive members 43.

When upper end parts of the electronic parts 42 of the submodule 40 are at positions lower than upper end parts of other electronic parts 30 mounted on a main substrate 20 together with the submodule 40, an interval in a height direction 4 between an upper film 61 of the shield film 60 and the electronic parts 42 of the submodule 40 becomes large. Therefore, shielding performance for the submodule 40 deteriorates. According to the fourth embodiment, it is possible to dispose the laterally extending parts 43G of the conductive members 43 near the upper end parts of the electronic parts 42 of the submodule 40. Consequently, it is possible to effectively shield the upper sides of the electronic parts 42 of the submodule 40 by the laterally extending parts 43G of the conductive members 43.

The position of each conductive member 43 (each upward extending part 43F and each laterally extending part 43G) is not limited to the positions illustrated in FIGS. 20 and 21. For example, each upward extending part 43F may be provided to an upper end part of the submodule 40 in FIG. 20. In this case, each laterally extending part 43G may extend downward in FIG. 20 from the distal end part 43Fa of each upward extending part 43F, and connected with the side film 62 provided on a lower side in FIG. 20 among the side films 62 of the shield film 60.

Portions at which the laterally extending parts 43G and the electronic parts 42 overlap in plan view are not limited to the portions illustrated in FIG. 20. At least part of the laterally extending parts 43G may overlap at least part of the electronic parts 42 in plan view. For example, all of the laterally extending parts 43G may overlap part of the electronic parts 42 in plan view.

The laterally extending parts 43G may not overlap the electronic parts 42 in plan view.

First Manufacturing Method of Submodule According to Fourth Embodiment

Hereinafter, a first manufacturing method of the submodule 40 included in the circuit module 1 according to the fourth embodiment will be described with reference to FIGS. 22 to 25.

Figure 22:
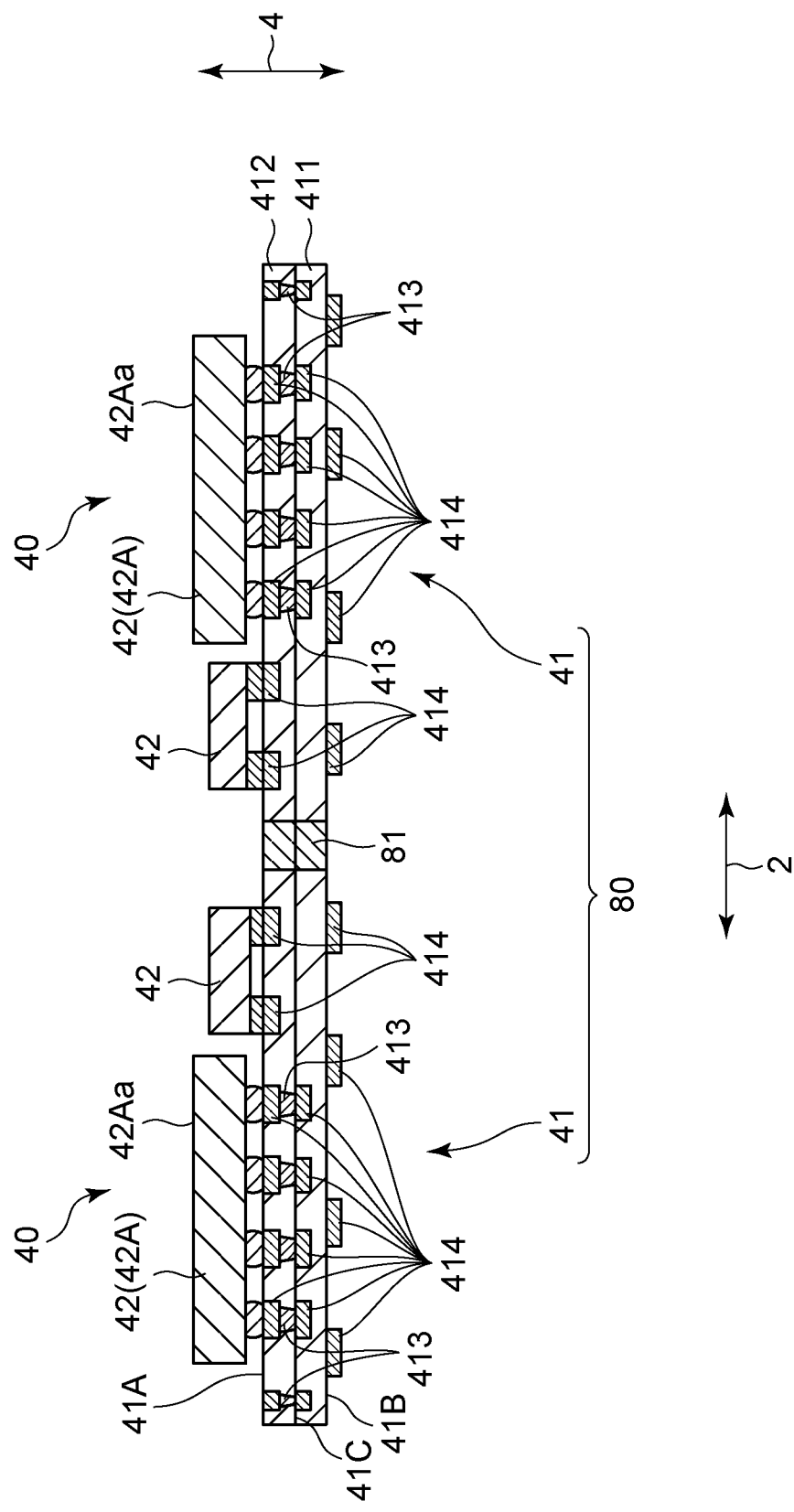
FIG. 22 is a cross-sectional view of a submodule in a state where electronic parts are mounted on a coupling substrate according to a first manufacturing method of the submodule of the circuit module according to the fourth embodiment of the present disclosure.
Figure 23:
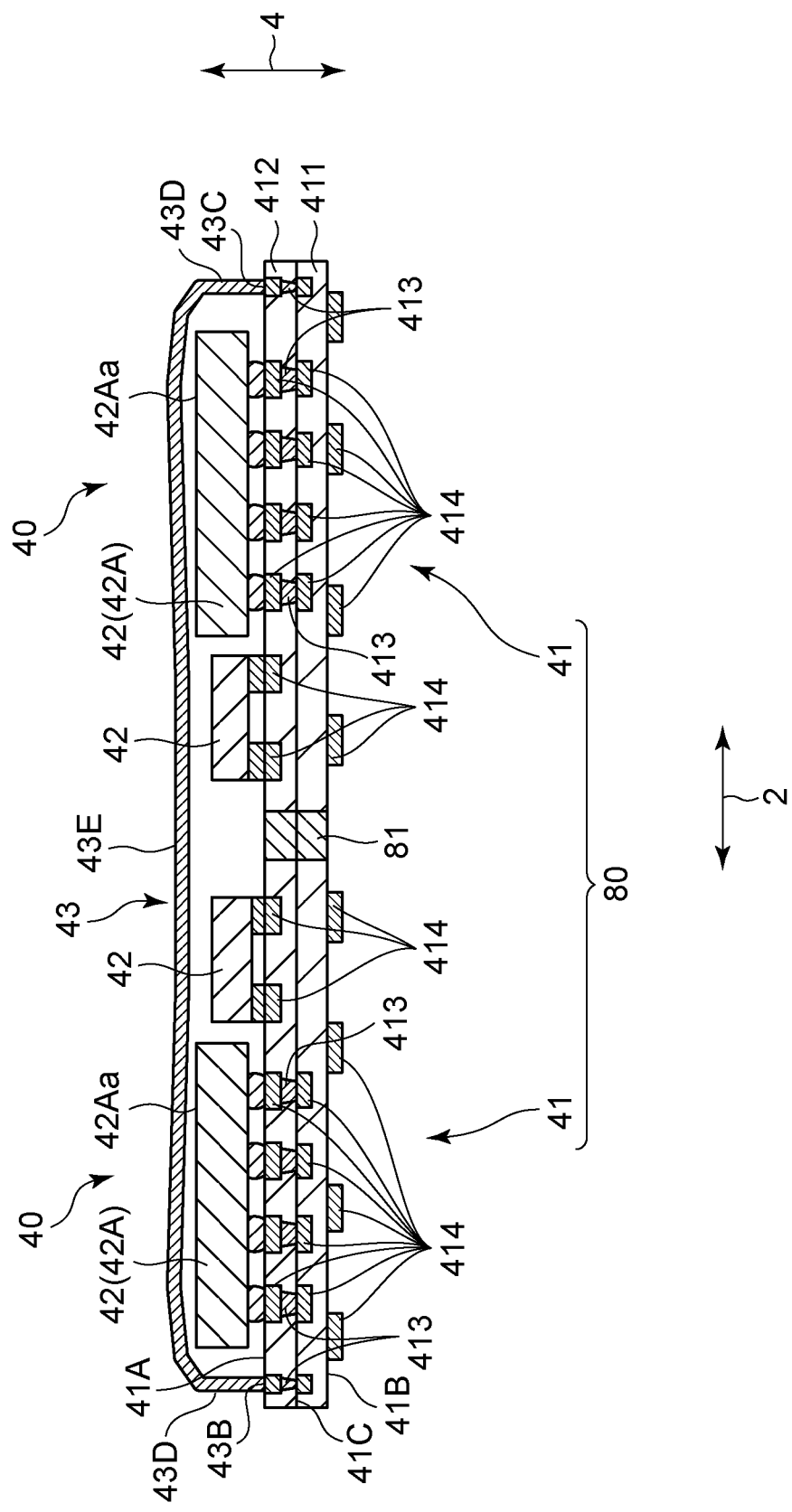
FIG. 23 is a cross-sectional view of the submodule in a state where the coupling substrate in FIG. 22 is connected with conductive members.
Figure 24:
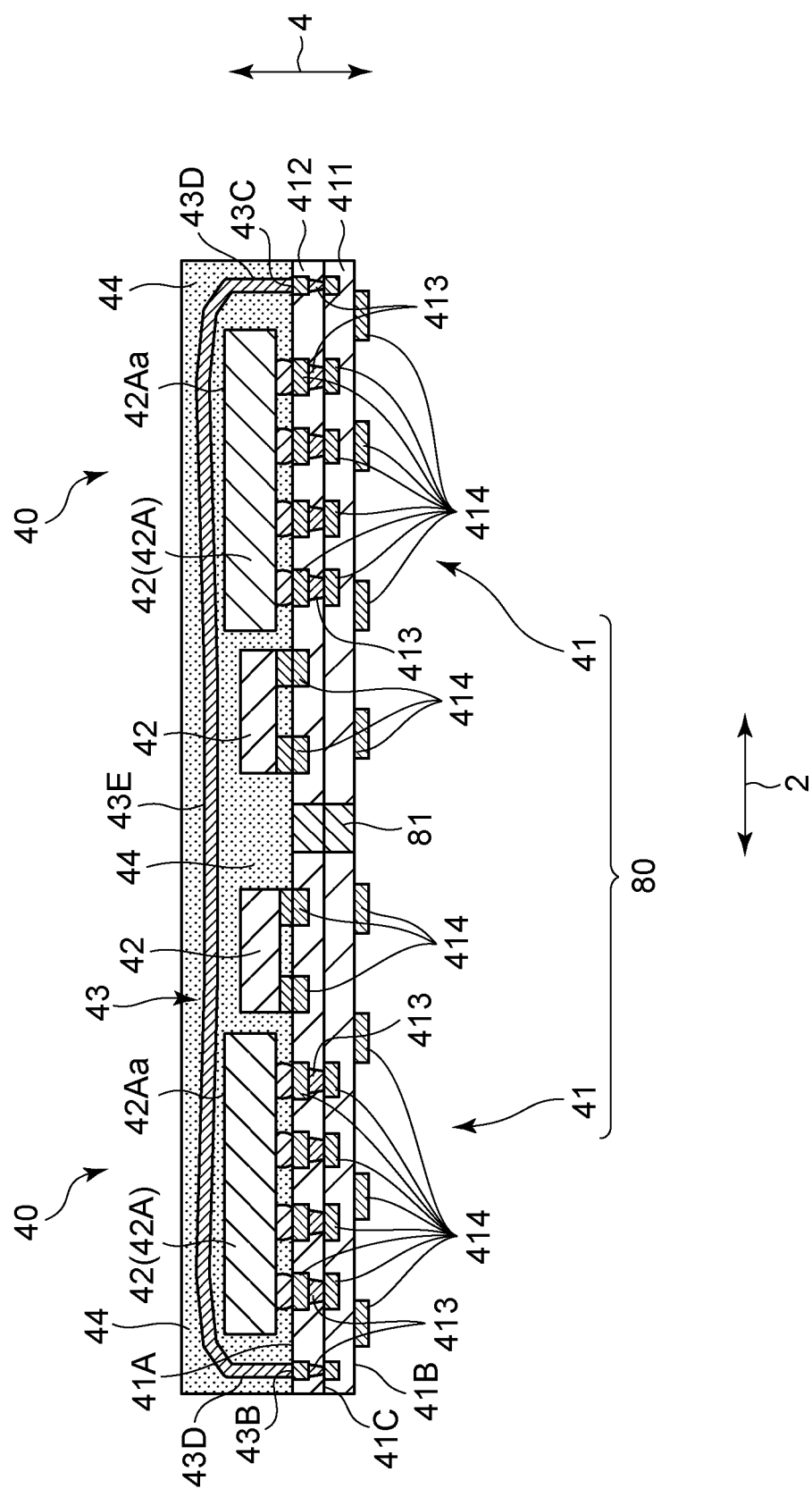
FIG. 24 is a cross-sectional view of the submodule in a state where the electronic parts and the conductive members in FIG. 23 are covered with a subsealing resin.
Figure 25:
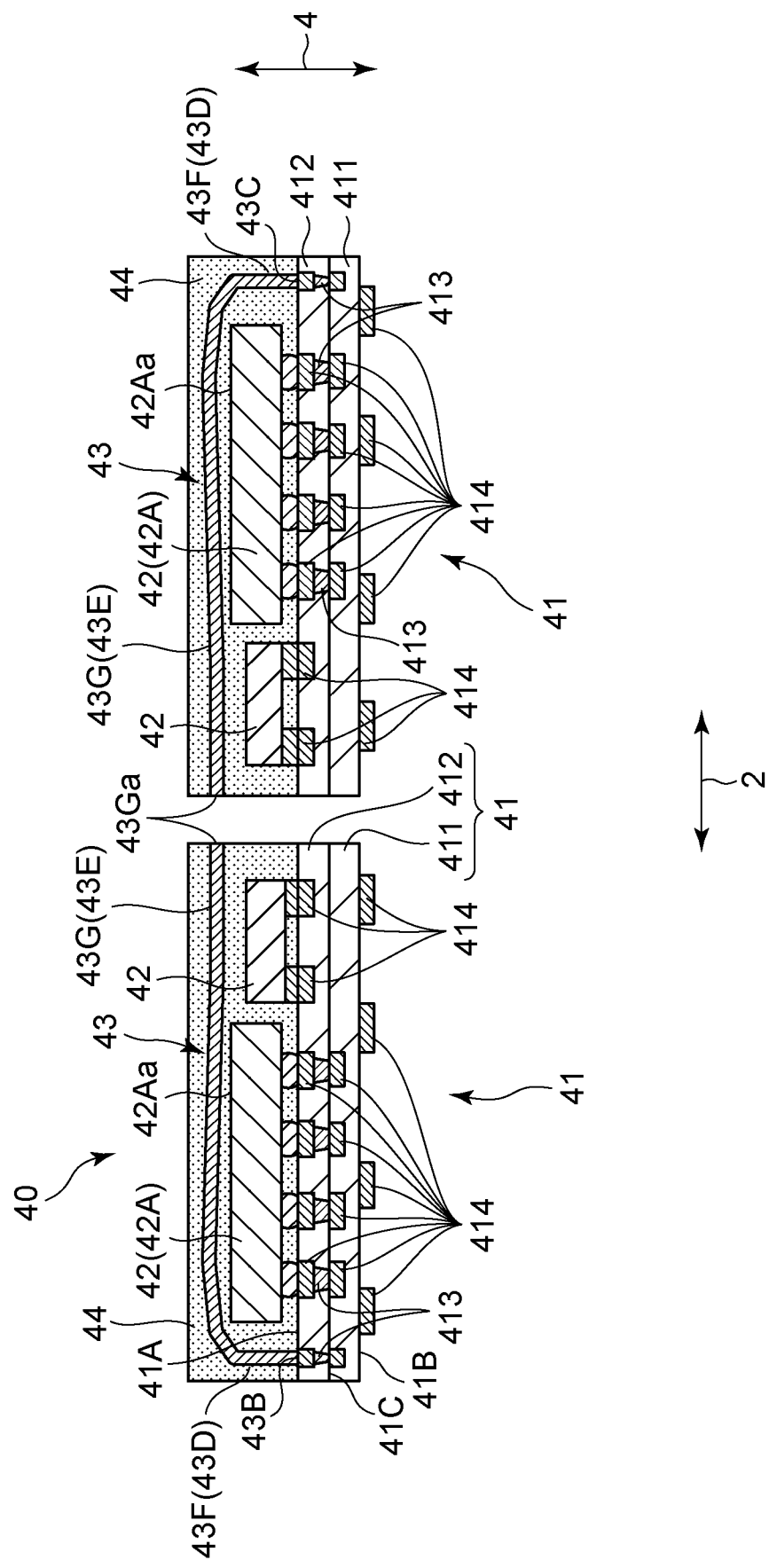
FIG. 25 is a cross-sectional view of the submodule in a state where the coupling substrate in FIG. 24 is divided into a plurality of sub-substrates.

FIG. 22 is a cross-sectional view of the submodule in a state where the electronic parts are mounted on a coupling substrate according to the first manufacturing method of the submodule of the circuit module according to the fourth embodiment of the present disclosure. FIG. 23 is a cross-sectional view of the submodule in a state where the coupling substrate in FIG. 22 is connected with the conductive members. FIG. 24 is a cross-sectional view of the submodule in a state where the electronic parts and the conductive members in FIG. 23 are covered with a subsealing resin. FIG. 25 is a cross-sectional view of the submodule in a state where the coupling substrate in FIG. 24 is divided into a plurality of sub-substrates.

First, a mounting process is executed. A mounting process of the first manufacturing method of the submodule 40 according to the fourth embodiment is a process similar to the mounting process of the third manufacturing method of the submodule 40 according to the first embodiment. In the mounting process, as illustrated in FIG. 22, the electronic parts 42 are mounted on a coupling substrate 80.

Similarly to a coupling substrate 70 according to the third manufacturing method of the submodule 40 according to the first embodiment, the coupling substrate 80 is formed by integrating the plurality of sub-substrates 41 in a state where the top surfaces 41A of the plurality of sub-substrates 41 are aligned on the same plane. A boundary part 81 is formed between the two adjacent sub-substrates 41. Similarly to boundary parts 71 according to the third manufacturing method of the submodule 40 according to the first embodiment, the boundary part 81 is removed in a substrate dividing process described later.

Next, a connecting process is executed. A connecting process of the first manufacturing method of the submodule 40 according to the fourth embodiment is a process similar to the connecting process of the third manufacturing method of the submodule 40 according to the first embodiment. In the connecting process, as illustrated in FIG. 23, the plurality of conductive members 43 having the linear shapes are connected to wiring electrodes 414 formed on the top surfaces 41A of the sub-substrates 41 constituting the coupling substrate 70. In FIG. 23, a first end part 43B of each conductive member 43 is connected to one of the two sub-substrates 41 adjacent in a longitudinal direction 2, and a second end part 43C of each conductive member 43 is connected to the other one of the two sub-substrates 41 adjacent in the longitudinal direction 2. The first end part 43B is an example of a first part. The second end part 43C is an example of a second part. In FIG. 23, one of the two sub-substrates 41 (the sub-substrate 41 located on a left side in FIG. 23) to which the conductive member 43 is connected is an example of a first sub-substrate. Furthermore, in FIG. 23, the other one of the two sub-substrates 41 (the sub-substrate 41 located on a right side in FIG. 23) to which the conductive member 43 is connected is an example of a second sub-substrate.

Thus, each conductive member 43 connected to the wiring electrode 414 of each sub-substrate 41 includes a pair of upward extending parts 43D and a top part 43E. The upward extending part 43D corresponds to the upward extending part 43F of the conductive member 43 in the submodule 40 that has been manufactured (see FIG. 25). The top part 43E corresponds to the laterally extending part 43G of the conductive member 43 in the submodule 40 that has been manufactured (see FIG. 25). The top part 43E vertically faces the top surface 41A of the sub-substrate 41.

The top part 43E passes directly over both of the electronic parts 42 mounted on the sub-substrate 41 (first sub-substrate) located on the left side, and the electronic parts 42 mounted on the sub-substrate 41 (second sub-substrate) located on the right side. That is, the top part 43E vertically faces both of the electronic parts 42 mounted on the two respective sub-substrates. Note that the top part 43E may not vertically face at least one of the electronic parts 42 mounted on the two respective sub-substrates.

Next, a covering process is executed. A covering process of the first manufacturing method of the submodule 40 according to the fourth embodiment is a process similar to the covering process of the third manufacturing method of the submodule 40 according to the first embodiment. In the covering process, as illustrated in FIG. 24, the electronic parts 42 mounted on the coupling substrate 80 in the mounting process and the plurality of conductive members 43 connected to the coupling substrate 80 in the connecting process are covered with a subsealing resin 44.

Next, a substrate dividing process is executed. A substrate dividing process of the first manufacturing method of the submodule 40 according to the fourth embodiment is a process similar to the substrate dividing process of the third manufacturing method of the submodule 40 according to the first embodiment. In the substrate dividing process, as illustrated in FIG. 25, the coupling substrate 80 and the subsealing resin 44 are cut in the height direction 4 at the boundary part 81. Consequently, the boundary part 81 is removed. As a result, the one coupling substrate 80 is divided into the plurality of sub-substrates 41. Furthermore, as a result, the distal end part 43Ga of the laterally extending part 43G of each conductive member 43 is exposed from a lateral side of the subsealing resin 44.

According to the first manufacturing method of the submodule 40 according to the fourth embodiment, it is possible to easily connect the conductive members 43 to the sub-substrate 41 in the connecting process by known wire bonding.

Furthermore, according to the first manufacturing method of the submodule 40 according to the fourth embodiment, the substrate dividing process is executed, so that it is possible to manufacture, from the one coupling substrate 80 including the one conductive member 43, the two or more sub-substrates 41 on each of which the conductive members 43 whose distal end parts 43Ga are laterally exposed are mounted.

Furthermore, according to the first manufacturing method of the submodule 40 according to the fourth embodiment, the substrate dividing process is executed, so that it is possible to manufacture, from the one coupling substrate 80 including the one conductive member 43, the two or more sub-substrates 41 on each of which the conductive members 43 that can shield lateral sides and upper sides of the electronic parts 42 of the submodules 40 are mounted.

Second Manufacturing Method of Submodule According to Fourth Embodiment

Hereinafter, a second manufacturing method of the submodule 40 included in the circuit module 1 according to the fourth embodiment will be described with reference to FIGS. 26 to 29.

Figure 26:
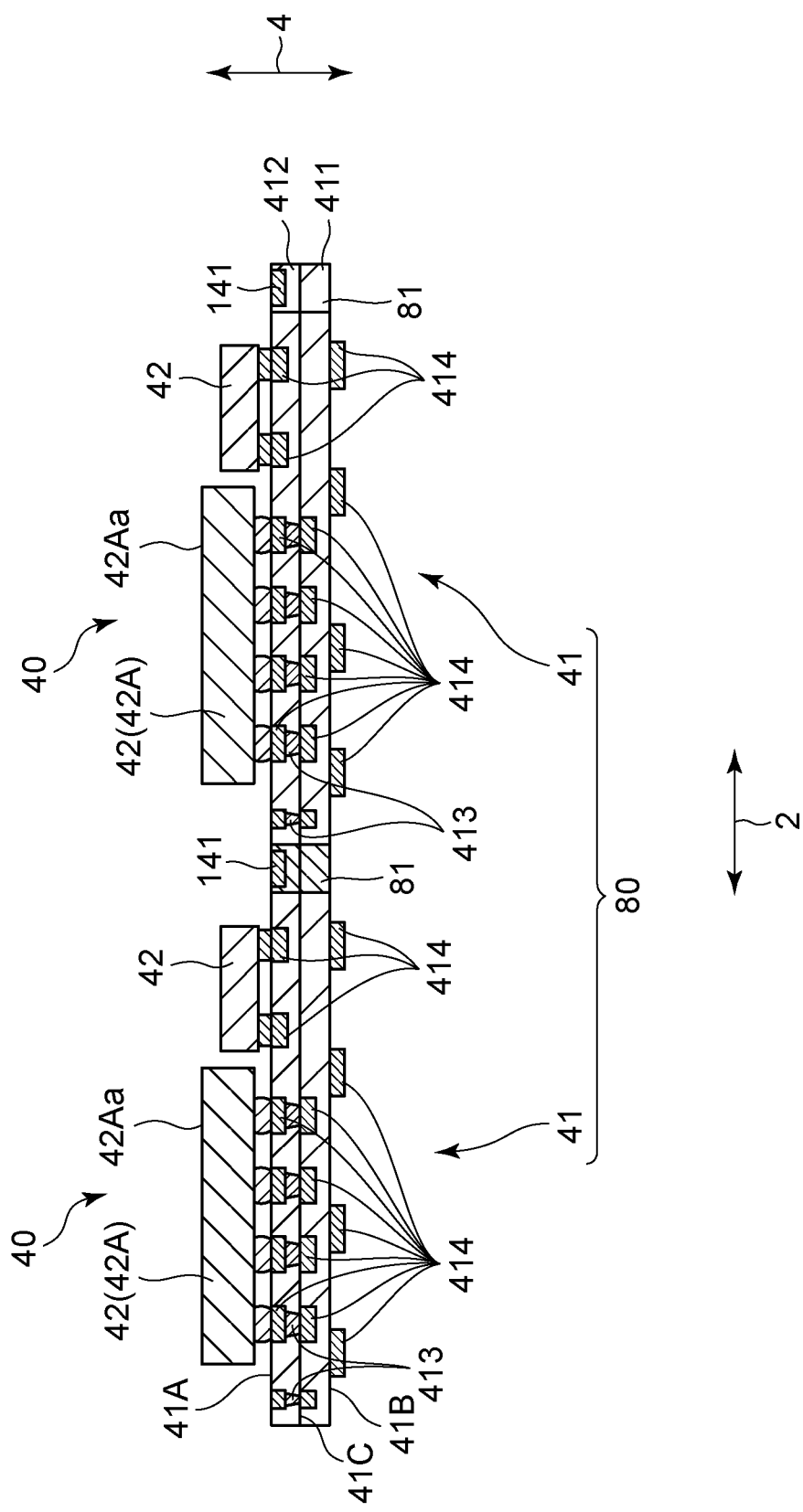
FIG. 26 is a cross-sectional view of the submodule in a state where the electronic parts are mounted on the coupling substrate according to a second manufacturing method of the submodule of the circuit module according to the fourth embodiment of the present disclosure.
Figure 27:
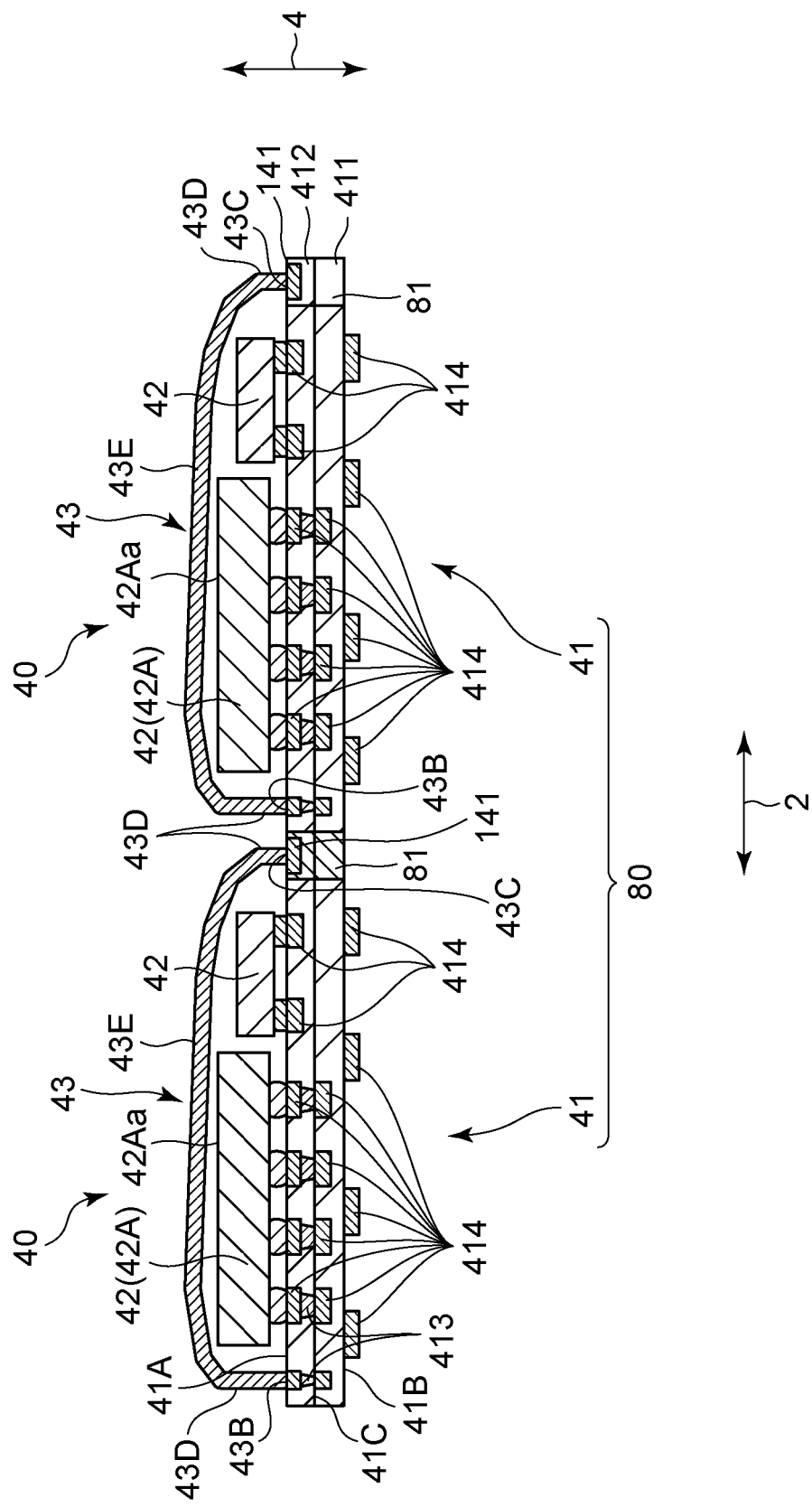
FIG. 27 is a cross-sectional view of the submodule in a state where the coupling substrate in FIG. 26 is connected with the conductive members.
Figure 28:
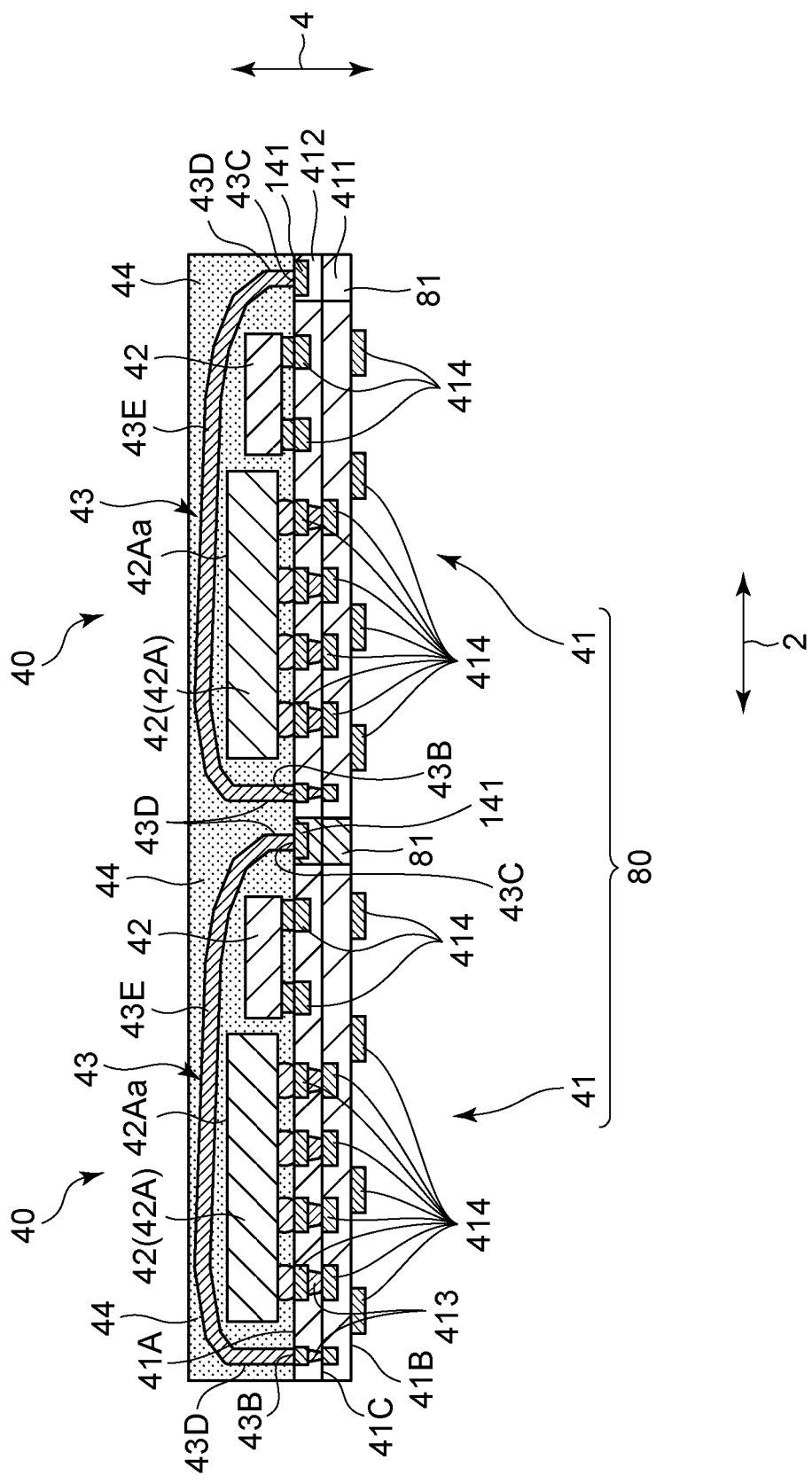
FIG. 28 is a cross-sectional view of the submodule in a state where the electronic parts and the conductive members in FIG. 27 are covered with a subsealing resin.
Figure 29:
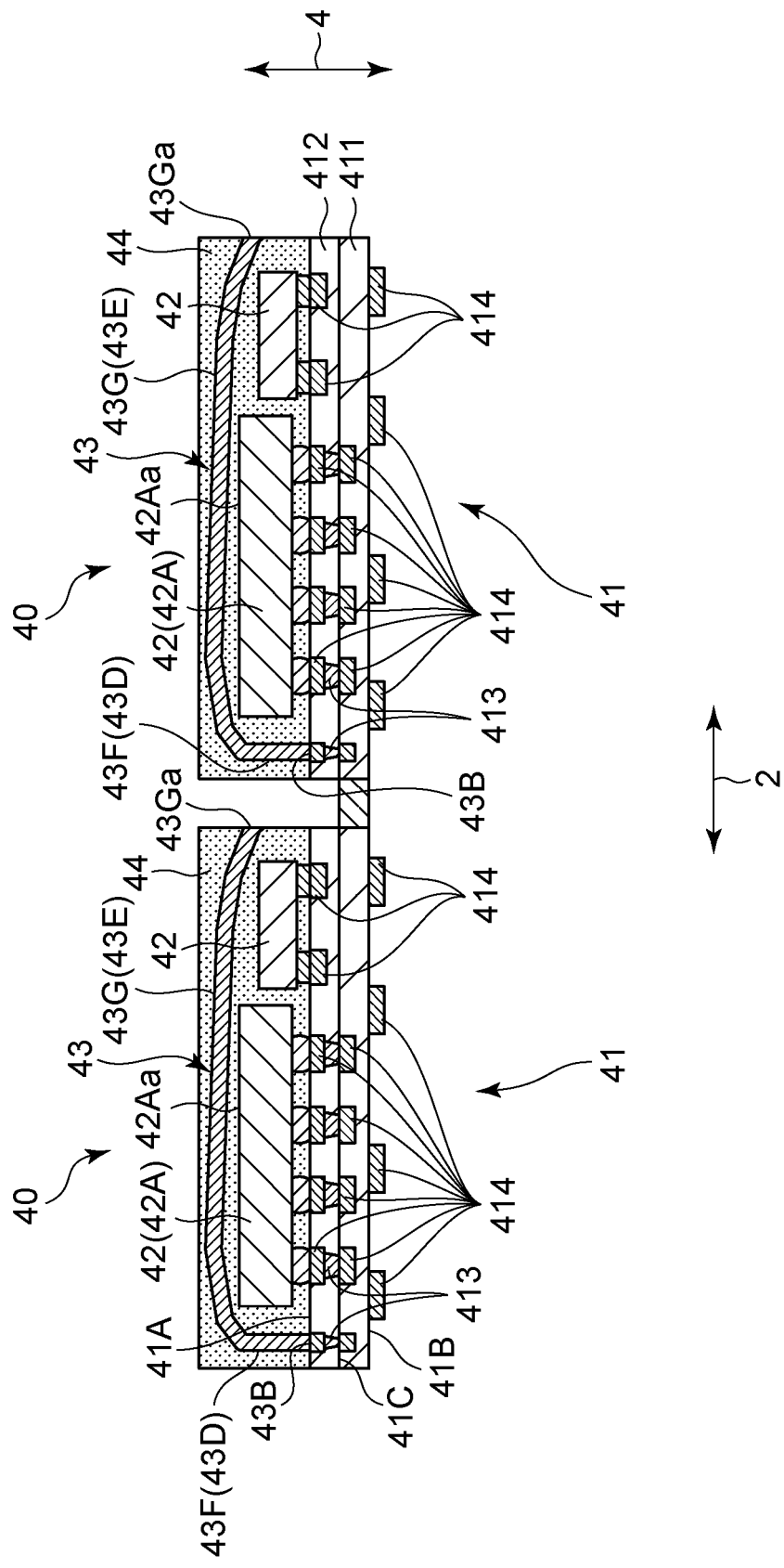
FIG. 29 is a cross-sectional view of the submodule in a state where the coupling substrate in FIG. 28 is divided into a plurality of sub-substrates.

FIG. 26 is a cross-sectional view of the submodule in a state where the electronic parts are mounted on the coupling substrate according to the second manufacturing method of the submodule of the circuit module according to the fourth embodiment of the present disclosure. FIG. 27 is a cross-sectional view of the submodule in a state where the coupling substrate in FIG. 26 is connected with the conductive members. FIG. 28 is a cross-sectional view of the submodule in a state where the electronic parts and the conductive members in FIG. 27 are covered with the sub-sealing resin. FIG. 29 is a cross-sectional view of the submodule in a state where the coupling substrate in FIG. 28 is divided into a plurality of sub-substrates.

First, a mounting process is executed. A mounting process of the second manufacturing method of the submodule 40 according to the fourth embodiment is a process similar to the mounting process of the first manufacturing method of the submodule 40 according to the fourth embodiment. However, according to the second manufacturing method, wiring electrodes 141 are formed on a top surface of the boundary part 81 of the coupling substrate 80. In the mounting process, as illustrated in FIG. 26, the electronic parts 42 are mounted on the coupling substrate 80.

Next, a connecting process is executed. A connecting process of the second manufacturing method of the submodule 40 according to the fourth embodiment is a process similar to the connecting process of the first manufacturing method of the submodule 40 according to the fourth embodiment. However, according to the second manufacturing method, as illustrated in FIG. 27, the first end part 43B of each conductive member 43 is connected to one of the two sub-substrates 41 adjacent in the longitudinal direction 2, and the second end part 43C of each conductive member 43 is connected to the wiring electrodes 141 formed on the top surface of the boundary part 81. The first end part 43B is an example of a first part. The second end part 43C is an example of a second part. In FIG. 26, one of the two sub-substrates 41 (the sub-substrate 41 located on a left side in FIG. 26) to which the conductive member 43 is connected is an example of a first sub-substrate. Furthermore, in FIG. 26, the other one of the two sub-substrates 41 (the sub-substrate 41 located on a right side in FIG. 26) to which the conductive member 43 is connected is an example of a second sub-substrate.

Consequently, each conductive member 43 connected to the wiring electrode 414 of the sub-substrate 41 and the wiring electrode 414 of the boundary part 81 includes the pair of upward extending parts 43D and the top part 43E. The upward extending part 43D corresponds to the upward extending part 43F of the conductive member 43 in the submodule 40 that has been manufactured (see FIG. 29). The top part 43E corresponds to the laterally extending part 43G of the conductive member 43 in the submodule 40 that has been manufactured (see FIG. 29). The top part 43E vertically faces the top surface 41A of the sub-substrate 41.

The top part 43E passes directly above both of the electronic parts 42 mounted on the sub-substrate 41 (first sub-substrate) located on the left side. Note that the top part 43E may not vertically face the electronic parts 42.

Next, a covering process is executed. A covering process of the second manufacturing method of the submodule 40 according to the fourth embodiment is a process similar to the covering process of the first manufacturing method of the submodule 40 according to the fourth embodiment. In the covering process, as illustrated in FIG. 28, the electronic parts 42 mounted on the coupling substrate 80 in the mounting process and the plurality of conductive members 43 connected to the coupling substrate 80 in the connecting process are covered with the subsealing resin 44.

Next, a substrate dividing process is executed. A substrate dividing process of the second manufacturing method of the submodule 40 according to the fourth embodiment is a process similar to the substrate dividing process of the first manufacturing method of the submodule 40 according to the fourth embodiment. In the substrate dividing process, as illustrated in FIG. 29, the coupling substrate 80 and the subsealing resin 44 are cut in the height direction 4 at the boundary part 81. Consequently, the boundary part 81 is removed. As a result, the one coupling substrate 80 is divided into the plurality of sub-substrates 41. Furthermore, as a result, the distal end part 43Ga of the laterally extending part 43G of each conductive member 43 is exposed from the lateral side of the subsealing resin 44.

According to the second manufacturing method of the submodule 40 according to the fourth embodiment, it is possible to easily connect the conductive members 43 to the sub-substrate 41 in the connecting process by known wire bonding.

Furthermore, according to the second manufacturing method of the submodule 40 according to the fourth embodiment, the substrate dividing process is executed, so that it is possible to manufacture the sub-substrate 41 on which the conductive members 43 whose distal end parts 43Ga are laterally exposed are mounted.

Furthermore, according to the second manufacturing method of the submodule 40 according to the fourth embodiment, the substrate dividing process is executed, so that it is possible to manufacture the sub-substrate 41 on which the conductive members 43 that can shield the lateral sides and the upper sides of the electronic parts 42 of the submodules 40 are mounted.

Fifth Embodiment

Figure 30:
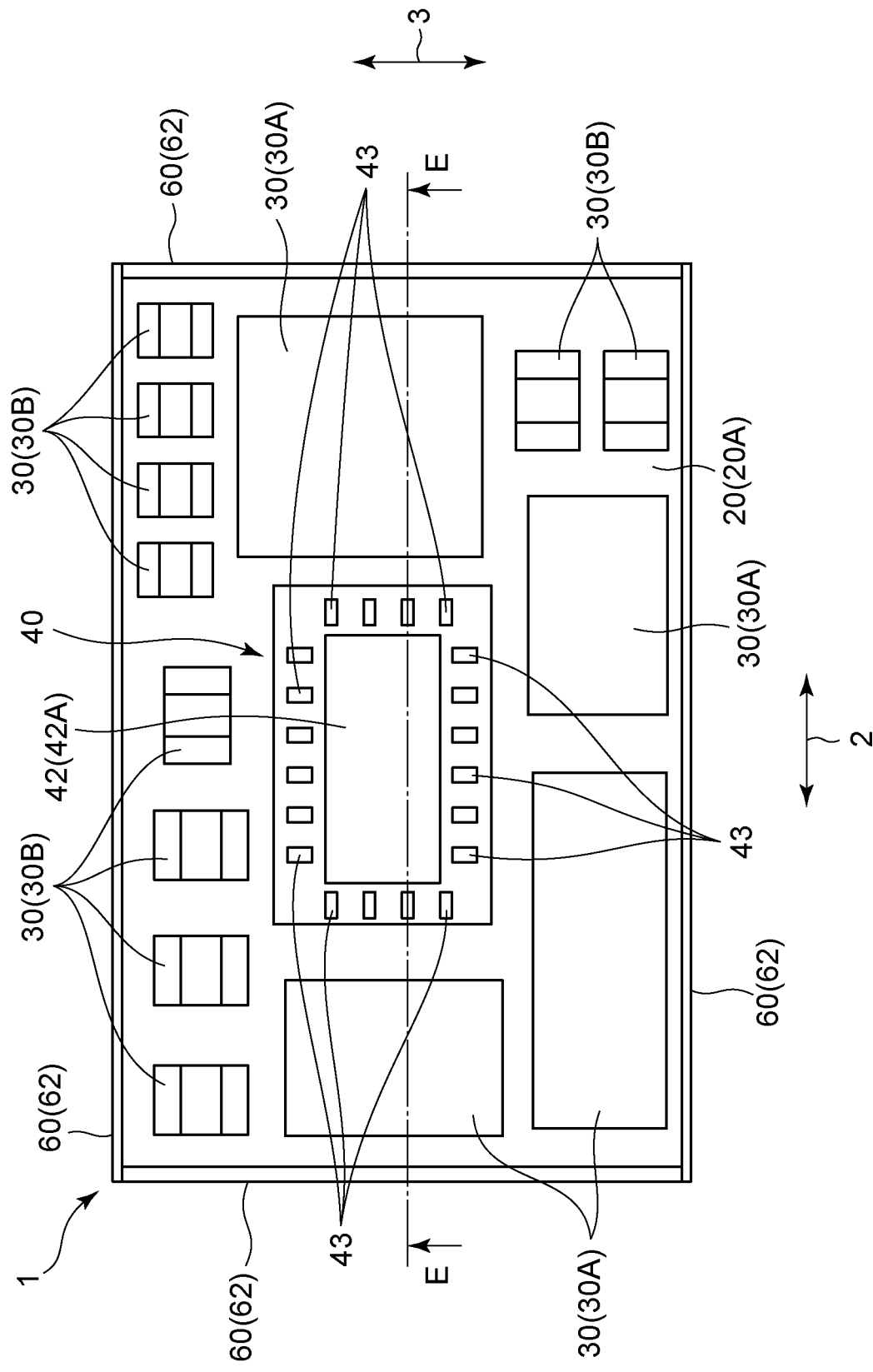
FIG. 30 is a plan view of a circuit module according to a fifth embodiment of the present disclosure.
Figure 31:
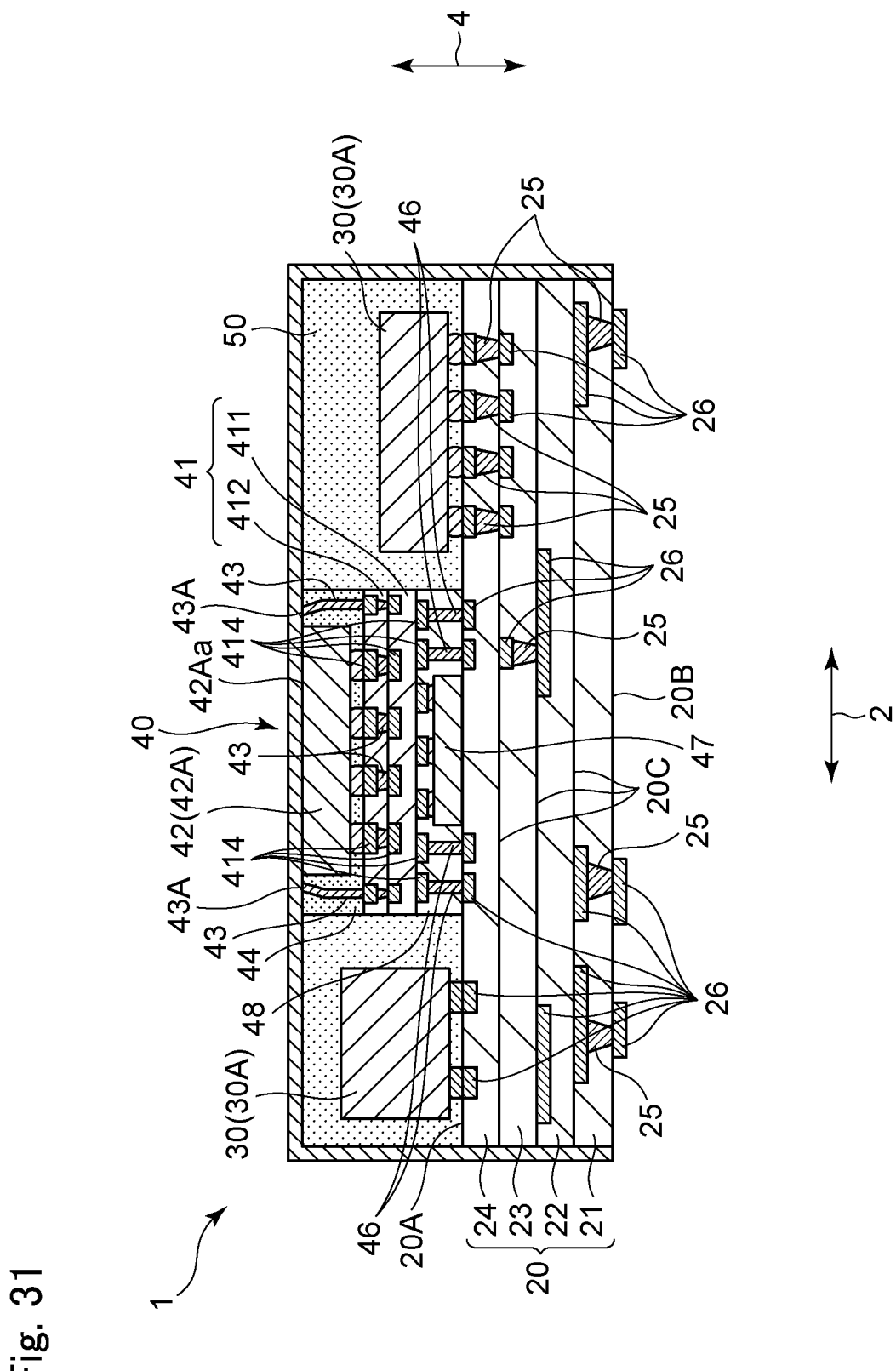
FIG. 31 is a cross-sectional view along line E-E in FIG. 30.

FIG. 30 is a plan view of a circuit module according to the fifth embodiment of the present disclosure. FIG. 31 is a cross-sectional view along line E-E in FIG. 30. A circuit module 1 according to the fifth embodiment differs from the circuit module 1 according to the first embodiment in that a submodule 40 includes terminals 46 disposed in a back surface 41B of a sub-substrate 41.

As illustrated in FIG. 31, the submodule 40 includes the terminals 46, an electronic part 47, and a subsealing resin 48 in addition to the sub-substrate 41, the electronic parts 42, a plurality of conductive members 43, and a subsealing resin 44.

The terminals 46 are mounted in the back surface 41B of the sub-substrate 41 of the submodule 40.

The terminal 46 is a conductive and non-linear member. In the fifth embodiment, the terminal 46 is a bar-like member made of copper. Note that the non-linear member means a member that is not easily bent. Furthermore, the linear member means a member that is easily bent.

The terminals 46 are connected to wiring electrodes 414 formed on the back surface 41B of the sub-substrate 41. The terminal 46 is conducted with each conductive member 43 via a via conductor 413, the wiring electrode 414 formed on an inner surface 41C, and the wiring electrode 414 formed on a top surface 41A. Note that, in the fifth embodiment, each conductive member 43 is a wire. That is, in the fifth embodiment, each conductive member 43 is a linear member. Note that each conductive member 43 may have a bar shape.

The terminals 46 are connected to wiring electrodes 26 formed on a top surface 20A of a main substrate 20. The terminals 46 are conducted with a shield film 60 via via conductors 25 and the wiring electrodes 26 formed at various portions of the main substrate 20.

Note that, although FIG. 31 illustrates the four terminals 46, the number of the terminals 46 mounted on the back surface 41B of the sub-substrate 41 is not limited to four.

The electronic part 47 is mounted on the back surface 41B of the sub-substrate 41 of the submodule 40. A configuration of the electronic part 47 is similar to those of the electronic parts 42. Note that, although FIG. 31 illustrates only the one electronic part 47, the number of the electronic parts 47 mounted on the back surface 41B of the sub-substrate 41 is not limited to one. Furthermore, the submodule 40 may not include the electronic part 47.

The subsealing resin 48 is provided on the back surface 41B of the sub-substrate 41. Similarly to the subsealing resin 44, the subsealing resin 48 is made of a resin such as an epoxy resin.

In the fifth embodiment, the subsealing resin 48 completely covers each terminal 46 and the electronic part 47. Note that the subsealing resin 48 may cover only part of the terminals 46 and the electronic part 47. Furthermore, the submodule 40 may not include the subsealing resin 48.

The terminals 46 disposed in the back surface 41B of the sub-substrate 41 of the submodule 40 come into contact with the top surface 20A of the main substrate 20, and thereby the submodule 40 is mounted on the main substrate 20. In a case where the terminals 46 disposed in the back surface 41B of the sub-substrate 41 have linear shapes, positions of the terminals 46 may be displaced with respect to the main substrate 20 when the submodule 40 is mounted on the main substrate 20. According to the fifth embodiment, the terminals 46 disposed in the back surface 41B of the sub-substrate 41 have non-linear bar shapes. Consequently, it is possible to reduce a probability that position displacement occurs as described above.

Distal end parts (upper end parts 43A) of the conductive members 43 are connected with the shield film 60. The shield film 60 are films, and therefore spreads planarly. Therefore, even when positions of the conductive members 43 are displaced, it is possible to connect the conductive members 43 with the shield film 60. Therefore, even when the conductive members 43 have the linear shapes that readily cause position displacement as in the fifth embodiment, no problem occurs. On the other hand, the conductive members 43 have the linear shapes, so that it is possible to suppress an increase in size of the sub-substrate 41 of the submodule 40.

Note that appropriately combining arbitrary embodiments among the various embodiments can provide the effects of the respective embodiments.

Although the present disclosure has been fully described in connection with the preferred embodiments thereof with reference to the accompanying drawings, it is to be noted that various changes and modifications are apparent to those skilled in the art. Such changes and modifications are to be understood as included within the scope of the present disclosure as defined by the appended claims unless they depart therefrom.

1 a circuit module
    20 a main substrate
    20A a top surface
    40 a submodule
    41 a sub-substrate
    41A a top surface
    41B a back surface
    42 an electronic part
    43 a conductive member 43A an upper end part (a distal end part)
43B a first end part (a first part)
43C a second end part (a second part)
43E a top part
43F an upward extending part
43Fa a distal end part
43G a laterally extending part
43Ga a distal end part
44 a subsealing resin
45 a planar electrode
45A a side surface
46 a terminal
50 a main sealing resin
60 a shield film
61 an upper film
62 a side film
70 a coupling substrate
71 a boundary part
80 a coupling substrate
81 a boundary part

What is claimed is:

1. A circuit module comprising:
a main substrate;
a submodule mounted on a top surface of the main substrate;
a main sealing resin provided on the top surface of the main substrate, and covering at least part of the submodule; and
a conductive shield film covering at least part of the main sealing resin, wherein
the submodule includes:
a sub-substrate,
an electronic part mounted on a top surface of the sub-substrate;
a plurality of conductive members having linear shapes or bar shapes, and connected to the top surface of the sub-substrate and the shield film; and
a subsealing resin provided on the top surface of the sub-substrate, and covering at least part of the electronic part and part of each of the plurality of conductive members.

2. The circuit module of claim 1, wherein
the shield film includes an upper film covering an upper side of the main sealing resin, and wherein
the plurality of conductive members are connected with the upper film.

3. The circuit module of claim 1, wherein
the electronic part is surrounded by the plurality of conductive members in plan view.

4. The circuit module of claim 1, wherein
the shield film includes a side film covering a lateral side of the main sealing resin, and wherein
the electronic part is surrounded by the plurality of conductive members and the side film in plan view.

5. The circuit module of claim 1, wherein
the shield film includes a side film covering a lateral side of the main sealing resin, and wherein
the sub-substrate includes a planar electrode, and a side surface of the planar electrode is exposed from a lateral side of the sub-substrate, and connected with the side film.

6. The circuit module of claim 5, wherein
the planar electrode is conducted with the plurality of conductive members.

7. The circuit module of claim 5, wherein
the electronic part is surrounded by the plurality of conductive members and the planar electrode in plan view.

8. The circuit module of claim 5, wherein
at least part of the planar electrode overlaps at least part of the electronic part in plan view.

9. The circuit module of claim 1, wherein
the shield film includes a side film covering a lateral side of the main sealing resin, and
each of the plurality of conductive members includes:
an upward extending part extending upward from a top surface of the sub-substrate; and
a laterally extending part extending laterally from a distal end part of the upward extending part, and wherein
a distal end part of the laterally extending part is connected with the side film.

10. The circuit module of claim 9, wherein
at least part of the laterally extending part overlaps at least part of the electronic part in plan view.

11. The circuit module of claim 1, wherein
the submodule further includes a non-linear terminal disposed in a back surface of the sub-substrate, and conducted with the plurality of conductive members, and wherein
the terminal is connected with the main substrate, and conducted with the shield film via the main substrate.

12. The circuit module of claim 11, wherein
the terminal has a bar shape.

13. The circuit module of claim 11, wherein
the plurality of conductive members have linear shapes.

14. A method for manufacturing the submodule comprised in the circuit module of claim 1, comprising:
a mounting step of mounting the electronic part on the top surface of the sub-substrate;
a connecting step of connecting the plurality of conductive members having linear shapes or bar shapes to the top surface of the sub-substrate; and
a covering step of covering at least part of the electronic part with the subsealing resin, and covering the plurality of conductive members with the subsealing resin at such postures that at least a distal end part of each of the plurality of conductive members is exposed upward.

15. A method for manufacturing the submodule comprised in the circuit module of claim 1, comprising:
a mounting step of mounting the electronic part on the top surface of the sub-substrate;
a connecting step of connecting two positions to the top surface of the sub-substrate such that a top part of each of the plurality of conductive members having linear shapes is located above the top surface of the sub-substrate, the two portions being located on both sides of the top part of each of the plurality of conductive members;
a covering step of covering the electronic part and the plurality of conductive members with the subsealing resin; and
a removing step of removing the top part of each of the plurality of conductive members by removing an upper part of the subsealing resin, and dividing each of the plurality of conductive members into two conductive members taking such postures that the two conductive members stand upward from the top surface of the sub-substrate and distal end parts of the two conductive members are exposed upward.

* * * * *